(12) United States Patent
Arai et al.

(10) Patent No.: US 8,963,593 B2
(45) Date of Patent: Feb. 24, 2015

(54) HIGH-FREQUENCY SIGNAL PROCESSING DEVICE

(71) Applicant: Renesas Electronics Corporation, Kanagawa (JP)

(72) Inventors: Chihiro Arai, Kanagawa (JP); Toshiya Uozumi, Kanagawa (JP); Keisuke Ueda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/217,971

(22) Filed: Mar. 18, 2014

(65) Prior Publication Data

US 2014/0266342 A1 Sep. 18, 2014

(30) Foreign Application Priority Data

Mar. 18, 2013 (JP) ................. 2013-055428

(51) Int. Cl.
*H03L 7/06* (2006.01)
*H03L 7/093* (2006.01)

(52) U.S. Cl.
CPC ..................... *H03L 7/093* (2013.01)
USPC .......................... 327/156; 327/147

(58) Field of Classification Search
None
See application file for complete search history.

(56) References Cited

U.S. PATENT DOCUMENTS

| 6,744,324 | B1 * | 6/2004 | Adams et al. | 331/17 |
| 6,838,951 | B1 * | 1/2005 | Nieri et al. | 331/177 V |
| 8,692,598 | B2 * | 4/2014 | Havens | 327/159 |
| 2005/0068119 | A1 | 3/2005 | Uozumi et al. | |
| 2005/0134336 | A1 * | 6/2005 | Goldblatt et al. | 327/156 |
| 2006/0267699 | A1 | 11/2006 | Uozumi et al. | |
| 2008/0278245 | A1 | 11/2008 | Uozumi et al. | |
| 2011/0133799 | A1 * | 6/2011 | Dunworth et al. | 327/157 |
| 2013/0300477 | A1 | 11/2013 | Ueda et al. | |

FOREIGN PATENT DOCUMENTS

JP 2005-109618 A 4/2005
WO 2012/101774 A1 8/2012

OTHER PUBLICATIONS

Wu et al., "Dependence of LC VCO Oscillation Frequency on Bias Current", IEEE International Symposium on Circuits and Systems, May 2006, pp. 5039-5042.

Groszkowski, "The Interdependence of Frequency Variation and Harmonic Content, and the Problem of Constant-Frequency Oscillators", Proceedings of the Institute of Radio Engineers, Jul. 1933, pp. 958-981, vol. 21, No. 7.

* cited by examiner

*Primary Examiner* — Cassandra Cox
(74) *Attorney, Agent, or Firm* — Mattingly & Malur, PC

(57) ABSTRACT

A high-frequency signal processing device having a frequency synthesizer (PLL: Phase Locked Loop) is provided. A control circuit measures oscillation frequencies obtained upon setting a bias current of an oscillation circuit to first and second bias setting values and acquires a frequency difference amount of the oscillation frequencies. The frequency difference amount may be acquired as difference amount of setting values of a coarse adjustment capacitance setting signal (CTRM) using, for example, an automatic frequency selector unit. The control circuit retains a relationship of a difference amount of bias setting values and a difference value of setting values of the CTRM and approximating the relationship to a linear function. Thereafter, the control circuit defines, upon switching the bias current during locking of the PLL, the CTRM based on the linear function and switches the CTRM together with the bias current.

20 Claims, 29 Drawing Sheets

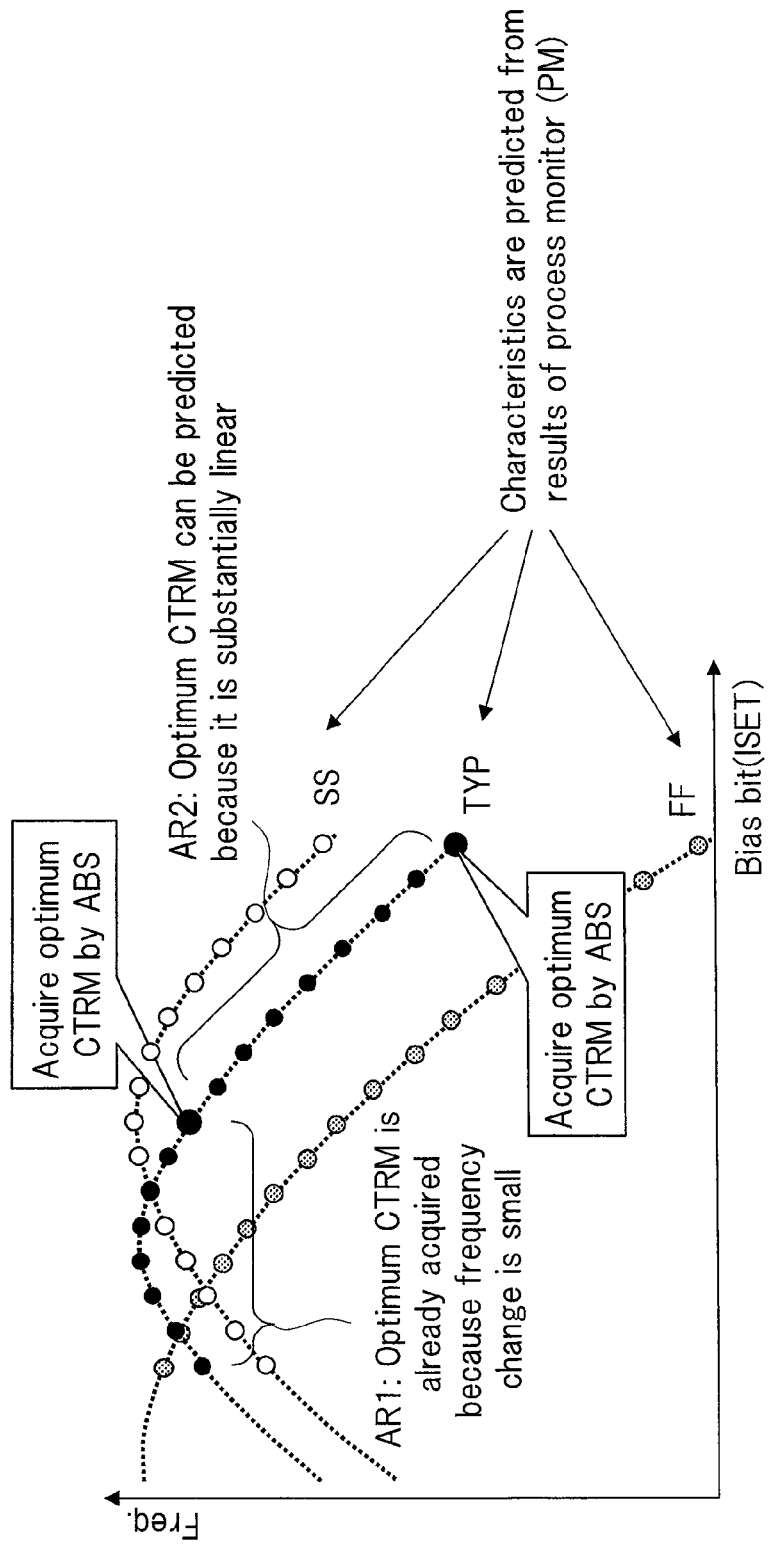

HIGH-FREQUENCY SIGNAL PROCESSING DEVICE

CROSS-REFERENCE TO RELATED APPLICATION

The present application claims priority from Japanese Patent Application No. 2013-055428 filed on Mar. 18, 2013, the content of which is hereby incorporated by reference into this application.

BACKGROUND

The present invention relates to a high-frequency signal processing device having a frequency synthesizer (PLL: Phase-Locked Loop) and to a wireless communication system. For example, the present invention relates to a high-frequency signal processing device performing modulation/demodulation using a frequency synthesizer and to a wireless communication system such as a mobile terminal etc. having the high-frequency signal processing device.

For example, International Application Publication No. WO2012/101774 (Patent Document 1) teaches a method of suppressing frequency fluctuations by switching capacitors of an oscillation circuit upon varying load (including switching current) of the oscillation circuit. Japanese Patent Application Laid-Open Publication No. 2005-109618 (Patent Document 2) teaches an automatic switching circuit for finding an optimum frequency band while switching frequency bands of a VCO by the binary search method. In addition, Ting Wu; Un-Ku Moon; Mayaram, K., "Dependence of LC VCO Oscillation Frequency on Bias Current," IEEE International Symposium on Circuits and Systems, May 2006 (Non-Patent Document 1) describes a theory of frequency fluctuation by increases in current. Groszkowski, J., "The Interdependence of Frequency Variation and Harmonic Content, and the Problem of Constant-Frequency Oscillators," Proceedings of the Institute of Radio Engineers, Vol. 21, No. 7, pp. 958-981, July 1933 (Non-Patent Document 2) describes a theory of oscillation frequency fluctuation by harmonics.

SUMMARY

For example, in mobile communications (e.g., WCDMA: Wideband Code Division Multiple Access) in which a plurality of terminals are relayed by one base station, to increase the number of terminals capable of communicating at the same time, it is needed to adjust transmission power of terminals in accordance with distances of the base station and the terminals so that power of each terminals the base station receives is kept constant. Thus, the terminals are provided with a function of adjusting power of a power amplifier at an output portion of a high-frequency signal processing device (hereinafter, called RFIC), thereby reducing power consumption when the distance from the base station is lessened.

To an RFIC, a PLL circuit needed for modulation/demodulation is mounted. The PLL circuit is composed mainly of an oscillation circuit, frequency demultiplier (divider) circuit, a phase comparator circuit, and a filter. The PLL circuit is a circuit for keeping oscillation frequencies constant by controlling a control voltage (or digital code) of the oscillation circuit by a feedback loop. A state in which oscillation frequencies are constant is called a "locked state" and a state in which they are unstable is called an "unlocked state".

The PLL circuit has a problem called injection locking (pulling) by which transmission power from power amplifier etc. interferes an output of the PLL circuit upon transmission operation. The injection locking can be prevented by increasing current of the oscillation circuit. However, when the current of the oscillation circuit is excessively increased, power consumption of the RFIC is increased. Thus, an optimum value of the current of the oscillation circuit is a minimum current value within a range (that is, a range capable of preventing the injection locking) of current value needed at minimum in accordance with the transmission power.

Here, as described above, when the transmission power is changed in accordance with the distance to the base station, the optimum value of the current of the oscillation circuit is changed. Thus, to further reduce the power consumption of RFIC including the PLL circuit, it is needed to switch the current of the oscillation circuit in accordance with the transmission power during locking of the PLL circuit. When switching the current of the oscillation circuit in accordance with the transmission power, since oscillation frequencies of the oscillation circuit depend on current consumption, unlocking is problematic. That is, since a free-run frequency (that is, a frequency at which the PLL circuit is open-loop) depends on current, when current is switched during locking, the oscillation frequencies are abruptly changed accordingly.

As a countermeasure of the problem, for example, as described in Patent Document 1, there is a method of switching capacitors of the oscillation circuit at the same time of switching current of the oscillation circuit. However, in this method, it is needed to perform calibration for determining an optimum capacitor each time to a current value of a switching destination and thus a start-up time of the PLL circuit may be very long. Further, since a calibration result depends on temperature in practice, for example, when there is a temperature change of the RFIC after locking, a situation may occur in which sufficient accuracy cannot be guaranteed by the calibration result acquired before the temperature change.

Embodiments described below have been made in view of the foregoing and the above and other preferred aims and novel characteristics of the present invention will be apparent from the description of the present specification and the accompanying drawings.

A high-frequency signal processing device according to an embodiment includes an oscillation circuit, a feedback loop circuit, a measurement circuit, and a control circuit. The oscillation circuit generates an oscillation output signal having a predetermined frequency, controls frequencies by a first resolution corresponding to a first frequency setting signal, controls frequencies by a second resolution that is higher than the first resolution corresponding to a second frequency setting signal, and operates with a bias current corresponding to a bias setting signal. The feedback loop circuit controls, when a loop setting signal is at an ON level, the second frequency setting signal by feedback control so that a phase of a signal obtained by feeding back the oscillation output signal and a phase of a reference clock signal are matched, and sets, when the loop setting signal is at an OFF level, the feedback control to an opened state. The measurement circuit measures the frequency of the oscillation output signal in a state in which the loop setting signal is at the off level. The control circuit carries out first to third processings. The control circuit makes the measurement circuit measure in the state in which the loop setting signal is at the OFF level in the first processing to measure a frequency difference amount between a frequency of the oscillation output signal obtained upon setting the bias setting signal to a first bias setting value and a frequency of the oscillation output signal obtained upon setting the bias setting signals at a second bias setting value. The control circuit retains, in the second processing, a relationship of a variable bias amount between the second bias setting value and the first bias setting value and the frequency difference amount obtained in the first processing by approximating the relationship to a linear function. The control circuit determines, in the third processing, in a state in which the loop setting signal is at the ON level, a changed amount of the frequency of the oscillation output signal with respect to a changed amount of the bias setting signal upon changing the bias setting signal based on the linear function in the second processing, and controls the first frequency setting signal based on the determined changed amount of the frequency.

According to the embodiment, shortening of calibration time can be achieved in a high-frequency signal processing device having a frequency synthesizer (PLL: Phase Locked Loop).

BRIEF DESCRIPTIONS OF THE DRAWINGS

FIG. 11 is a schematic diagram illustrating, including variations in manufacturing, an example of oscillation frequency characteristics with respect to a bias setting signal in the high-frequency signal processing device according to the first embodiment of the present invention;

DETAILED DESCRIPTION OF THE EXEMPLARY EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Moreover, although not particularly limited to this, circuit elements composing each of functional blocks of the embodiments are formed on a semiconductor substrate such as single crystal silicon by integrated circuit technology of known CMOS (complementary MOS transistor) etc. Note that, in the embodiments, MOSFET (Metal Oxide Semiconductor Field Effect Transistor; abbreviated as MOS transistor) will be used as an example of MISFET (Metal Insulator Semiconductor Field Effect Transistor; abbreviated as MIS transistor). However, non-oxide films are not excepted to be used as a gate insulating film (gate insulator).

Hereinafter, embodiments of the present invention will be described in detail with reference to the accompanying drawings. Note that components having the same function are denoted by the same reference symbols throughout the drawings for describing the embodiment, and the repetitive description thereof will be omitted.

<<Schematic Configuration of a High-frequency Signal Processing Device and Wireless Communication System (Present Embodiment)>>

Figure 1:
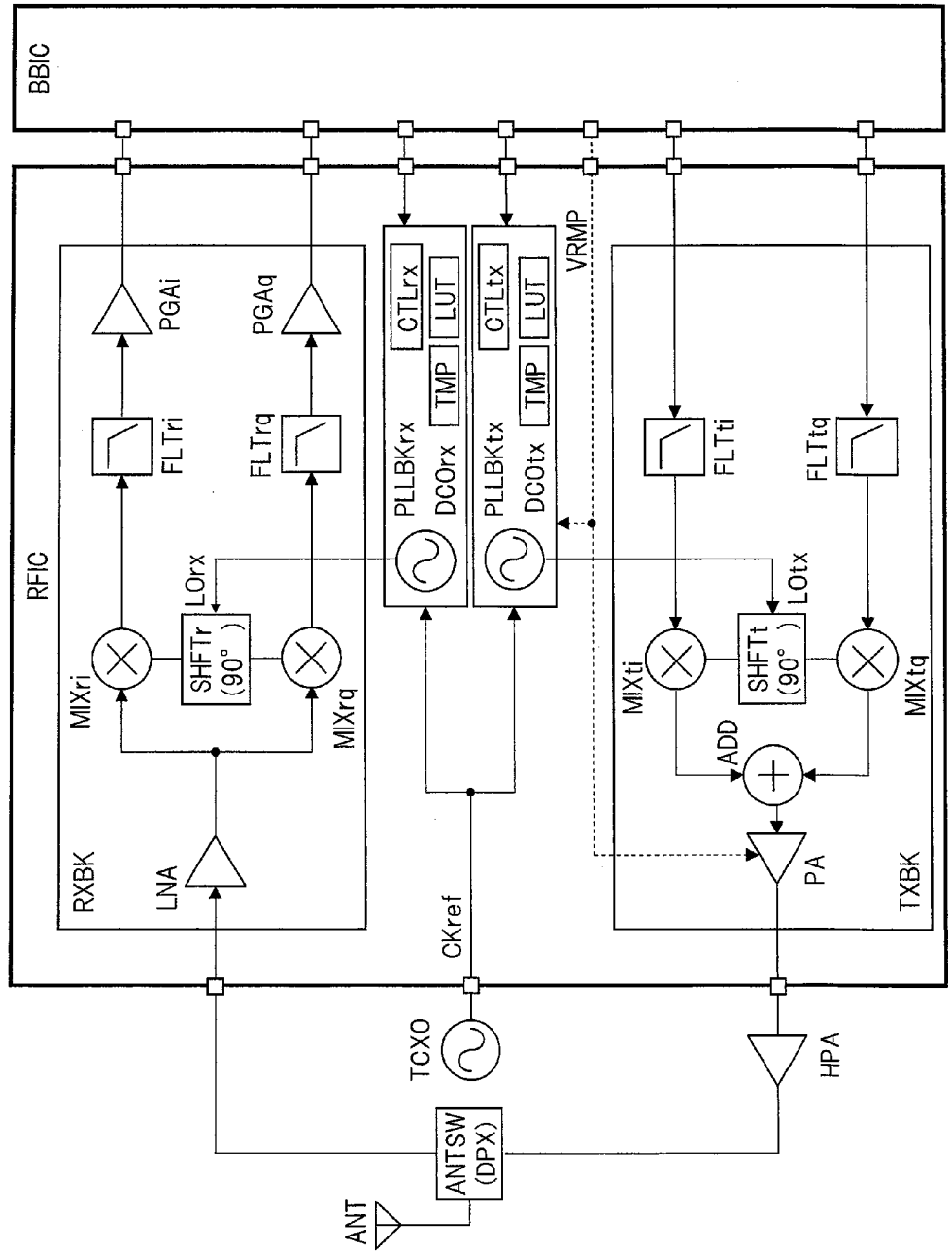
FIG. 1 is a block diagram illustrating an outline configuration example of a wireless communication system according to an embodiment of the present invention.

FIG. 1 is a block diagram illustrating a schematic configuration example of a wireless communication system according to an embodiment of the present invention. The wireless communication illustrated in FIG. 1 is, for example, a mobile phone system and includes a baseband processing device BBIC, a high-frequency signal processing device RFIC, a reference clock generator device TCXO, a power amplifier circuit HPA, an antenna switch ANTSW (or duplexer DPX), and an antenna ANT.

The baseband processing device BBIC performs, for example, a predetermined processing needed in a baseband width using a processor etc. and performs a processing of an output of a transmission baseband signal to the high-frequency signal processing device RFIC and a processing of a reception baseband signal outputted by the high-frequency signal processing device RFIC, and so forth. In addition, the baseband processing device BBIC outputs a transmitting power instruction signal VRMP to the high-frequency signal processing device RFIC based on a signal for power instruction transmitted from a base station not illustrated or else. The signal for instructing power is a signal suitably determined corresponding to a distance between the base station and the wireless communication system and, in practice, transferred to the baseband processing device BBIC via the antenna ANT and high-frequency signal processing device RFIC etc. The baseband processing device BBIC further performs instruction of a transmission frequency band and reception frequency band, and so forth.

The power amplifier circuit HPA amplifies power of a high-frequency signal outputted by the high-frequency signal processing device RFIC and outputs the high-frequency signal to the antenna switch ANTSW (or duplexer DPX). Upon a transmission operation, the antenna switch ANTSW (or duplexer DPX) transfers a high-frequency signal having power amplified by the power amplifier circuit HPA to the antenna ANT, and upon a reception operation, the antenna switch ANTSW transfers a high-frequency signal received by the antenna ANT to the high-frequency signal processing device RFIC. The antenna switch ANTSW includes, for example, a plurality of switches etc., ON/OFF of which is controlled corresponding to the instruction signals for transmission and reception from the high-frequency signal processing device RFIC etc. For example, when a TDD (Time Division Duplex) method such as the GSM (Global System for Mobile Communications) etc. is used, a communication relationship of the antenna ANT and the high-frequency signal processing device RFIC is controlled by the antenna switch ANTSW. Meanwhile, the duplexer DPX includes a filter for separating the transmission frequency band and the reception frequency band, etc. For example, when an FDD (Frequency Division Duplex) method such as WCDMA, LTE (Long Term Evolution), or else is used, the connection relationship of the antenna ANT and the high-frequency signal processing device RFIC is controlled by the duplexer DPX.

The reference clock generator device TCXO generates a reference clock signal CKref having a fixed frequency using, for example, a crystal oscillation circuit or else. The high-frequency signal processing device RFIC includes a transmission circuit block TXBK, a reception circuit block RXBK, a transmission PLL block PLLBKtx, and a reception PLL block PLLBKrx. The transmission circuit block TXBK up-converts (in other words, frequency conversion or modulation) a transmission baseband signal outputted by the baseband processing device BBIC to a predetermined transmission frequency band and outputs the same to the power amplifier circuit HPA. At this timing, the transmission PLL block PLLBKtx generates a local signal (oscillation output signal) LOtx having the predetermined transmission frequency band using the reference clock signal CKref.

The reception circuit block RXBK receives a high-frequency signal having a predetermined frequency band and transferred via the antenna ANT and the antenna switch ANTSW, and down-converts (in other words, frequency conversion or demodulation) the high-frequency signal to a baseband bandwidth. At this timing, the reception PLL block PLLBKrx generates a local signal (oscillation output signal) LOrx having the predetermined reception frequency band using the reference clock signal CKref. In addition, the reception circuit block RXBK outputs the signal after being down-converted as a reception baseband signal to the baseband processing device BBIC.

The transmission block TXBK includes, in more detail, filter circuits FLTti and FLTtq, mixer circuits MIXti and MIXtq, a phase shift circuit SHFTt, an adder ADD, and a power amplifier circuit PA. Here, so-called quadrature modulation (IQ modulation) is used. The filter circuits FLTti and FLTtq output an I-side transmission baseband signal and a Q-side transmission baseband signal outputted by the baseband processing device BBIC to the mixer circuits MIXti and MIXtq, respectively, after performing bandlimitation. The phase shifter circuit SHFTt receives a local signal LOtx and generates local signals having phases different by 90° and then outputs one of them to the mixer circuit MIXti and the other to the mixer circuit MIXtq.

The mixer circuits MIXti and MIXtq up-convert (IQ modulation) the I-side and Q-side transmission baseband signals inputted via the filter circuits FLTti and FLTtq using the local signal (oscillation output signal) LOtx inputted via the phase shifter circuit SHFTt. The adder ADD synthesizes output signals of the mixer circuits MIXti and MIXtq. The power amplifier circuit PA amplifies an output signal of the adder ADD by a gain based on a transmission power instruction signal VRMP and outputs a high-frequency signal obtained by the amplification to the power amplifier circuit HPA. Note that, although the transmission power is controlled by controlling inputted power of the power amplifier circuit HPA in the configuration, in some cases, a configuration in which a gain of the power amplifier circuit HPA is controlled corresponding to the transmitting power instruction signal VRMP or a configuration in which the transmitting power instruction signal VRMP is outputted to both of the power amplifier circuit PA and the power amplifier circuit HPA may be used.

The reception circuit block RXBK includes, in more detail, a low-noise amplifier circuit LNA, mixer circuits MIXri and MIXrq, a phase shifter circuit SHFTr, filter circuits FLTri and FLTrq, and variable gain amplifier circuits PGAi and PGAq. Here, so-called quadrature modulation (IQ demodulation) is used. The low-noise amplifier circuit LNA amplifies, with low noise, a high-frequency signal transferred via the antenna ANT and the antenna switch ANTSW (or duplexer DPX). The phase shifter circuit SHFTr receives a local signal LOrx and generates local signals having phases being different by 90° and outputs one of them to the mixer circuit MIXri and the other to the mixer circuit MIXrq.

The mixer circuits MIXri and MIXrq down-converts (IQ demodulation) an output signal of the low-noise amplifier circuit LNA using a local signal (oscillation output signal) LOrx inputted via the phase shifter circuit SHFTr. The filter circuits FLTri and FLTrq output output signals of the mixer circuits MIXri and MIXrq to the variable gain amplifier circuits PGAi and PGAq, respectively, after performing band limitation. The variable gain amplifier circuits PGAi and PGAq amplify the output signals of the mixer circuits MIXri and MIXrq inputted via the filter circuits FLTri and FLTrq so that amplitude fluctuations are reduced, respectively, and output I-side and Q-side reception baseband signals obtained thereby to the baseband processing device BBIC.

The transmission PLL block PLLBKtx includes a transmission oscillation circuit DCOtx, a temperature sensor TMP, a memory circuit LUT, and a transmission control circuit CTLtx. In the same manner, the reception PLL block PLLBKrx also includes a reception oscillation circuit DCOrx, a temperature sensor TMP, a memory circuit LUT, and a reception control circuit CTLrx. The temperature sensor TMP and the memory circuit LUT can be shared by the transmission PLL block PLLBKtx and the reception PLL block PLLBKrx. Note that details of the transmission PLL block PLLBKtx will be suitably described later.

Here, current of the transmission oscillation circuit DCOtx is, from the vie point of reducing power consumption and noise of the high-frequency signal processing device RFIC, as described above, preferable to have a minimum current value within a range capable of preventing injection locking corresponding to transmission power (that is, transmitting power instruction signal VRMP) of the power amplifier circuit PA and the power amplifier circuit HPA. Accordingly, the transmission PLL block PLLBKtx changes a bias setting signal described below based on the transmitting power instruction signal VRMP described above to control bias current of the transmission oscillation circuit DCOtx.

<<Configuration and Operation of PLL Block>>

Figure 2:
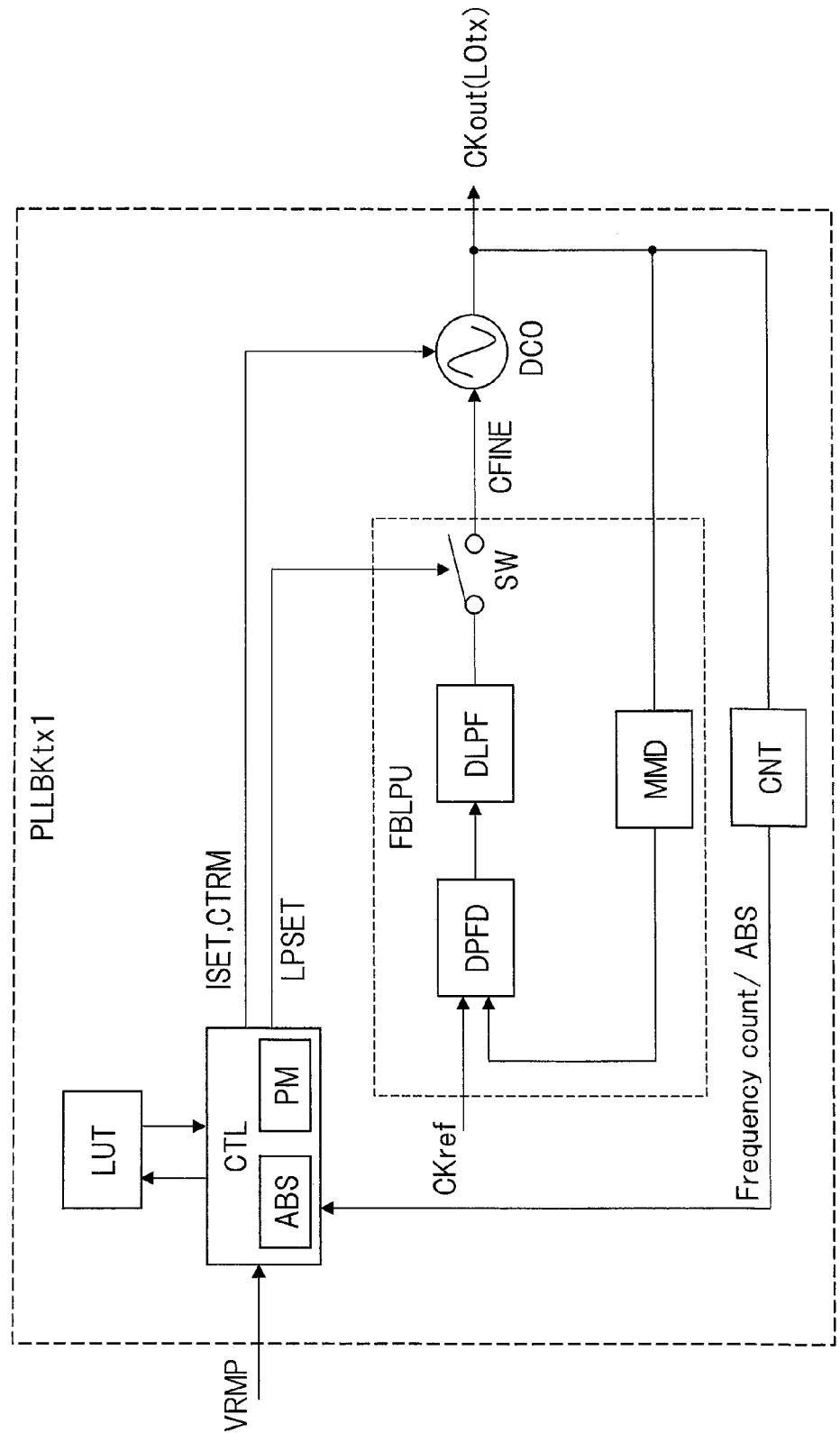
FIG. 2 is a block diagram illustrating a detailed configuration example of a transmission PLL block in FIG. 1.

FIG. 2 is a block diagram illustrating a detailed configuration example of the transmission PLL block in FIG. 1. The transmission PLL block PLLBKtx illustrated in FIG. 2 includes an oscillation circuit DCO, a feedback loop circuit FBLPU, a control circuit CTL, a counter circuit (measurement circuit) CNT, and a memory circuit LUT. In some cases, the memory circuit LUT can be provided externally to the high-frequency signal processing device RFIC. The oscillation circuit DCO generates an oscillation output signal CKout (local signal LOtx) having a determined frequency (that is, transmission frequency band). At this timing, the frequency of the oscillation circuit DCO is controlled by a coarse adjustment capacitance setting signal (first frequency setting signal) CTRM and a fine capacitance setting signal (second frequency setting signal) CFINE. Resolution of frequency setting by the fine capacitance setting signal CFINE is higher than that of frequency setting by the coarse adjustment capacitance setting signal CTRM. In addition, the oscillation circuit DCO is operated with a bias current corresponding to a bias setting signal ISET.

When the loop setting signal LPSET is at an ON level, the feedback loop circuit FBLPU controls the fine capacitance setting signal (second frequency setting signal) CFINE by feedback control so that a phase of a signal obtained by feeding back the oscillation output signal CKout and a phase of the reference clock signal CKref are matched. In addition, the feedback loop circuit FBLPU sets the feedback control in an opened state when the loop setting signal LPSET is at an OFF level and sets the oscillation circuit DCO in a free-run (opened-loop) state.

The feedback loop circuit FBLPU includes, in more details, a phase comparator circuit DPFD, a loop filter circuit DLPF, a switch SW, and a frequency divider circuit MMD. The frequency divider circuit MID divides a frequency of the oscillation output signal CKout at a set frequency dividing ratio and feeds back the oscillation output signal CKout to the phase comparator circuit DPFD. The phase comparator circuit DPFD compares phase differences of the fed back oscillation output signal CKout and the reference clock signal reference clock signal CKref generated by the reference clock generator circuit TCXO in FIG. 1 and outputs a control signal corresponding to the direction and size of the phase differences. The loop filter circuit DLPF averages the control signal and outputs the averaged control signal to the oscillation circuit DCO as the fine capacitance setting signal (second frequency setting signal) CFINE. The switch SW is controlled to be ON when the loop setting signal LPSET is at an ON level and to be OFF when the loop setting signal LPSET is at an OFF level.

According to such a configuration of the oscillation circuit DCO and the feedback loop circuit FBLPU, the frequency of the oscillation output signal CKout in a locked state is determined based on the reference clock signal CKref and the frequency dividing ratio set by the frequency divider circuit MMD. The frequency dividing ratio is suitably determined based on an instruction signal of a transmission frequency band outputted by the baseband processing device BBIC in FIG. 1. Note that, here, a so-called digital PLL is assumed as the configuration of the oscillation circuit DCO and the feedback loop circuit FBLPU. In the digital PLL, the fine capacitance setting signal (second frequency setting signal) CFINE is given by a digital code and the oscillation circuit DCO adjusts the frequency of the oscillation output signal CKout based on the digital code. However, the configuration is not limited to the digital PLL and may be an analog PLL. In the analog PLL, an oscillation circuit of voltage control type is used and the second frequency setting signal is given by a voltage level.

The counter circuit (measurement circuit) CNT measures the frequency of the oscillation output signal CKout by counting the oscillation output signal CKout. For example, the counter circuit CNT measures the number of counts of the oscillation output signal CKout in one cycle of the reference clock signal CKref. In the present embodiment, the counter circuit CNT is used when measuring a free-run frequency of the oscillation circuit DCO in a state in which the loop setting signal LPSET is at an OFF level (that is, the switch SW is OFF). The control circuit CTL is composed of, for example, a logic circuit, a processor, and so forth, and outputs the bias setting signal ISET, the coarse adjustment capacitance setting signal (first frequency setting signal) CTRM, and the loop setting signal LPSET. The control circuit CTL includes, although details will be described later, an automatic band selector unit ABS and a process monitor unit PM and outputs the bias setting signal ISET, coarse adjustment capacitance setting signal CTRM, and loop setting signal LPSET reflecting measurement results by the transmitting power instruction signal VRMP and counter circuit CNT and information inside the memory circuit LUT. Note that, although the configuration of the transmission PLL block PLLBKtx has been described here, the configuration of the reception PLL block PLLBKrx is the same.

Figure 3:
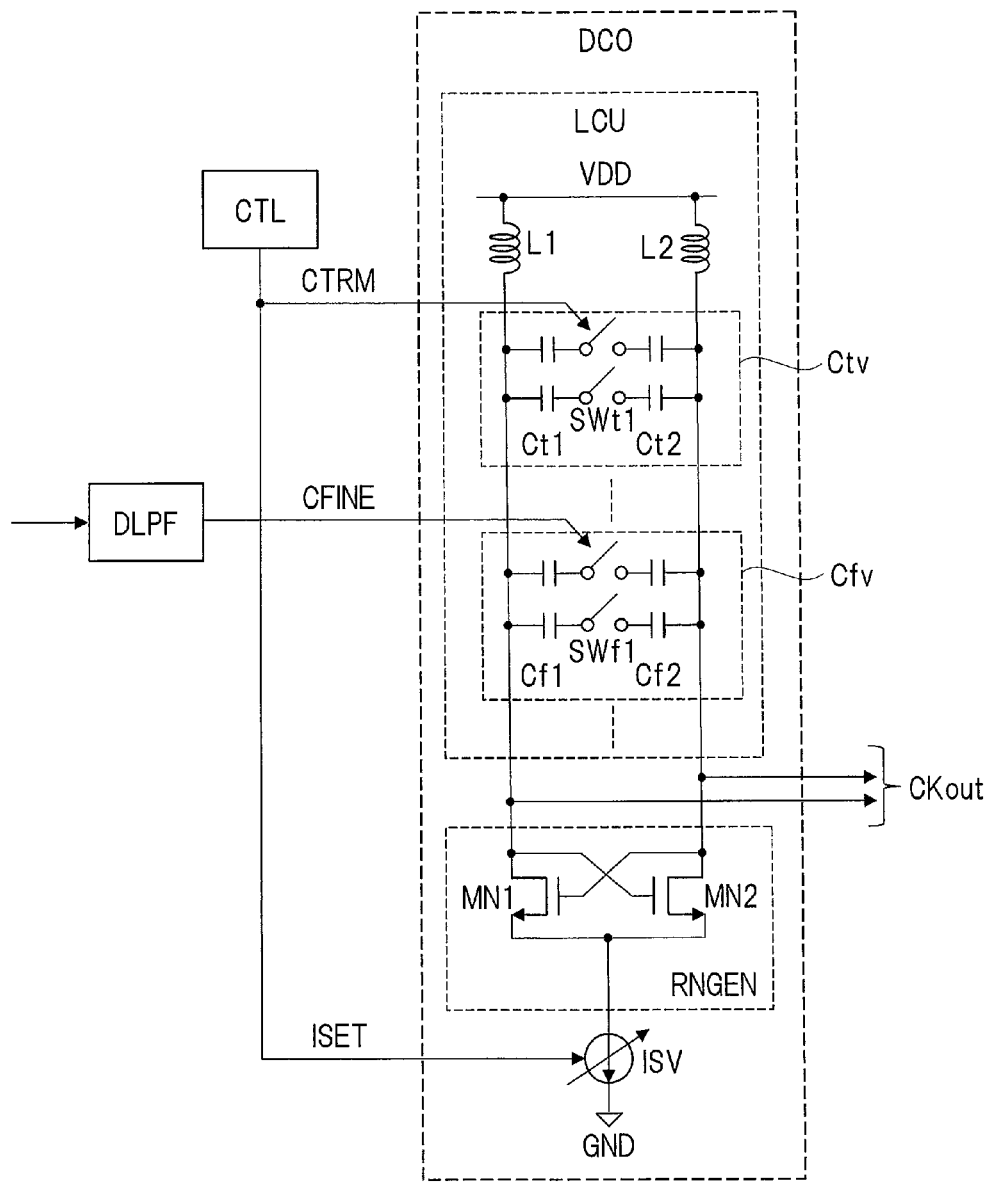
FIG. 3 is a circuit diagram illustrating a configuration example of an oscillation circuit in FIG. 2.

FIG. 3 is a circuit diagram illustrating a configuration example of the oscillation circuit in FIG. 2. The oscillation circuit DCO illustrated in FIG. 3 includes an LC tank circuit LCU, an amplifier circuit (negative resistance generating circuit) RNGEN coupled to the LC tank circuit LCU, and a variable current source ISV coupled to the amplifier circuit RNGEN. The LC tank circuit LCU includes inductors L1 and L2, a coarse adjustment variable capacitor (first variable capacitor) Ctv, and a fine adjustment variable capacitor (second variable capacitor) Cfv. Power supply voltage VDD is supplied to one end of each of the inductors L1 and L2. The coarse adjustment variable capacitor Ctv and the fine adjustment variable capacitor Cfv are connected in parallel between the other end of the inductor L1 and the other end of the inductor L2. A capacitance value (that is, frequency) of the coarse adjustment variable capacitor Ctv is controlled to correspond to the coarse adjustment capacitance setting signal (first frequency setting signal) CTRM. A capacitance value (that is, frequency) of the fine adjustment variable capacitor Cfv is controlled to correspond to the fine capacitance setting signal (second frequency setting signal) CFINE. Although not particularly limited to this, a frequency resolution by the coarse adjustment variable capacitor Ctv is on the order of MHz, and that by the fine adjustment variable capacitor Cfv is on the order of kHz.

The coarse adjustment variable capacitor (first variable capacitor) Ctv includes a plurality of direct connection circuits connected in parallel between the other ends of the inductors L1 and L2. Each of the direct connection circuits include a capacitor (e.g., Ct1), a switch (e.g., SWt1), and a capacitor (e.g., Ct2) which are subsequently connected. As the switch (e.g., SWt1) is controlled to be ON, each capacitor (e.g., Ct1, Ct2) contributes to setting of the oscillation frequency. Thus, by suitably controlling ON/OFF of the switch included in each of the plurality of direct connection circuits using the coarse adjustment capacitance setting signal (first frequency setting signal) CTRM, the oscillation frequency is controlled at a predetermined resolution (for example, MHz order).

In the same manner, the fine adjustment variable capacitor (second variable capacitor) Cfv also includes a plurality of direct connection circuits connected in parallel between the other ends of the inductors L1 and L2. Each of the direct connection circuits include a capacitor (e.g., Cf1), a switch (e.g., SWf1), and a capacitor (e.g., Cf2) which are subsequently connected. As the switch (e.g., SWf1) is controlled to be ON, each capacitor (e.g., Cf1, Cf2) contributes to setting of the oscillation frequency. Thus, by suitably controlling ON/OFF of the switch included in each of the plurality of direct connection circuits using the fine capacitance setting signal (second frequency setting signal) CFINE, the oscillation frequency is controlled at a predetermined resolution (for example, kHz order).

The amplifier circuit (negative resistance generating circuit) RNGEN includes two NMOS transistors MN1 and MN2 connected by so-called cross coupling and generates a negative resistance component so as to cancel out a resistance component of the LC tank circuit LCU. Drains of the NMOS transistors MN1 and MN2 are connected to the other ends of the inductors L1 and L2, respectively. The variable current source ISV is connected between common sources of the NMOS transistors MN1 and MN2 and a ground power supply voltage GND and generates a bias current corresponding to the bias setting signal ISET.

Figure 4:
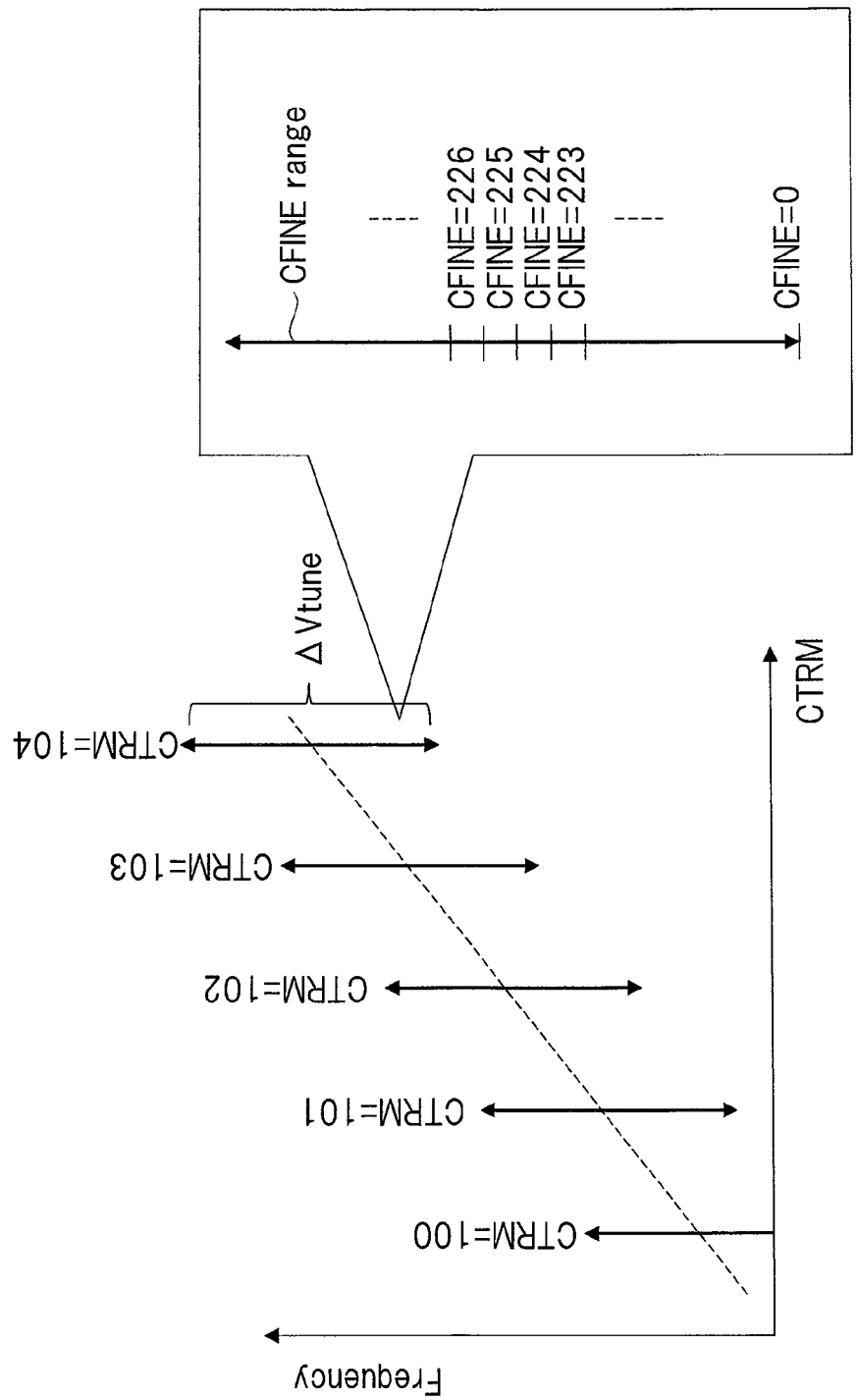
FIG. 4 is an explanatory diagram illustrating a schematic operation example of the oscillation circuit in FIG. 3.

FIG. 4 is an explanatory diagram illustrating a schematic operation example of the oscillation circuit in FIG. 3. As illustrated in FIG. 4, the oscillation frequency of the oscillation output signal CKout is roughly controlled corresponding to the digital code of the coarse adjustment capacitance setting signal (first frequency setting signal) CTRM and finely controlled corresponding to the digital code of the fine capacitance setting signal (second frequency setting signal) CFINE. For example, when CTRM=104 is set, the oscillation frequency can be adjusted in a plurality of steps (e.g., 512 steps) based on the fine capacitance setting signal CFINE smaller than and larger than a frequency corresponding to CTRM=104 in a range centering the frequency corresponding to CTRM=104. Also, for example, a range of a frequency (absolute value) obtained by a combination of CTRM=104 and AVtune and a range of frequency (absolute value) obtained by a combination of CTRM=103 and AVtune are designed to be partially overlapped.

<<Operation of Automatic Frequency Selector Unit>>

Figure 5A:
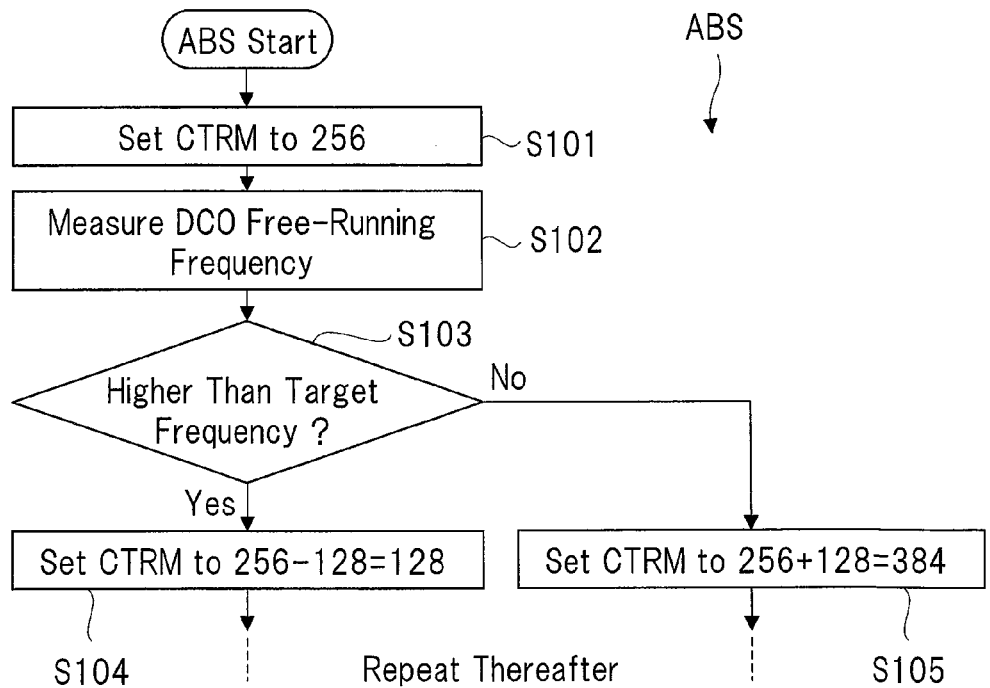
FIG. 5A is a diagram illustrating an operation example of an automatic frequency selector unit in a control circuit in FIG. 2.
Figure 5B:
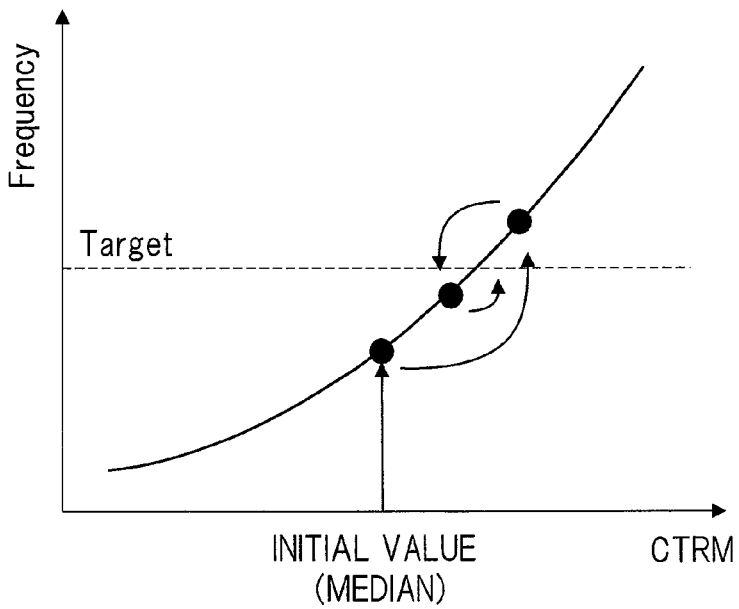
FIG. 5B is a diagram illustrating an operation example of the automatic frequency selector unit in the control circuit in FIG. 2.

FIGS. 5A and 5B are diagrams illustrating operation examples of an automatic frequency selector unit in the control circuit in FIG. 2. The automatic band selector unit ABS has functions of making the counter circuit (measurement circuit) CNT measure in a state in which the loop setting signal LPSET in FIG. 2 is at an OFF level and automatically search for a setting value of the coarse adjustment capacitance setting signal (first frequency setting signal) CTRM to be optimum upon setting the frequency of the oscillation output signal CKout at a target frequency.

In FIG. 5A, an example in which the capacitance value of the coarse adjustment variable capacitor (first variable capacitor) Ctv in FIG. 3 can be set in 512 steps. In this case, the automatic band selector unit ABS first sets a setting value of the coarse adjustment capacitance setting signal (first frequency setting signal) CTRM at 256 that is a median and measures a free-run frequency of the oscillation circuit DCO using the counter circuit CNT (S101, S102). Next, the automatic band selector unit ABS determines whether the measured frequency is higher or lower than the previously set target frequency (S103). The target frequency is previously set as the number of counts corresponding to a transmission frequency.

Subsequently, the automatic band selector unit ABS sets the coarse adjustment capacitance setting signal (first frequency setting signal) CTRM to 128 (=256−128) when the measured frequency is higher than the target frequency (S104); and sets the coarse adjustment capacitance setting signal CTRM to 384 (=256+128) when the measured frequency is lower than the target frequency (S105). Thereafter, in the same manner, the automatic band selector unit ABS repeats, using a so-called binary search illustrated in FIG. 5B, the setting of the coarse adjustment capacitance setting signal CTRM, measurement of the oscillation frequency, and comparison to the target frequency until an optimum coarse adjustment capacitance setting signal CTRM is obtained. Note that the method of the automatic band selector unit ABS is not limited to those in FIGS. 5A and 5B as long as an optimum setting value of the coarse adjustment capacitance setting signal CTRM can be obtained.

<<Operation of Process Monitor Unit>>

Figure 6:
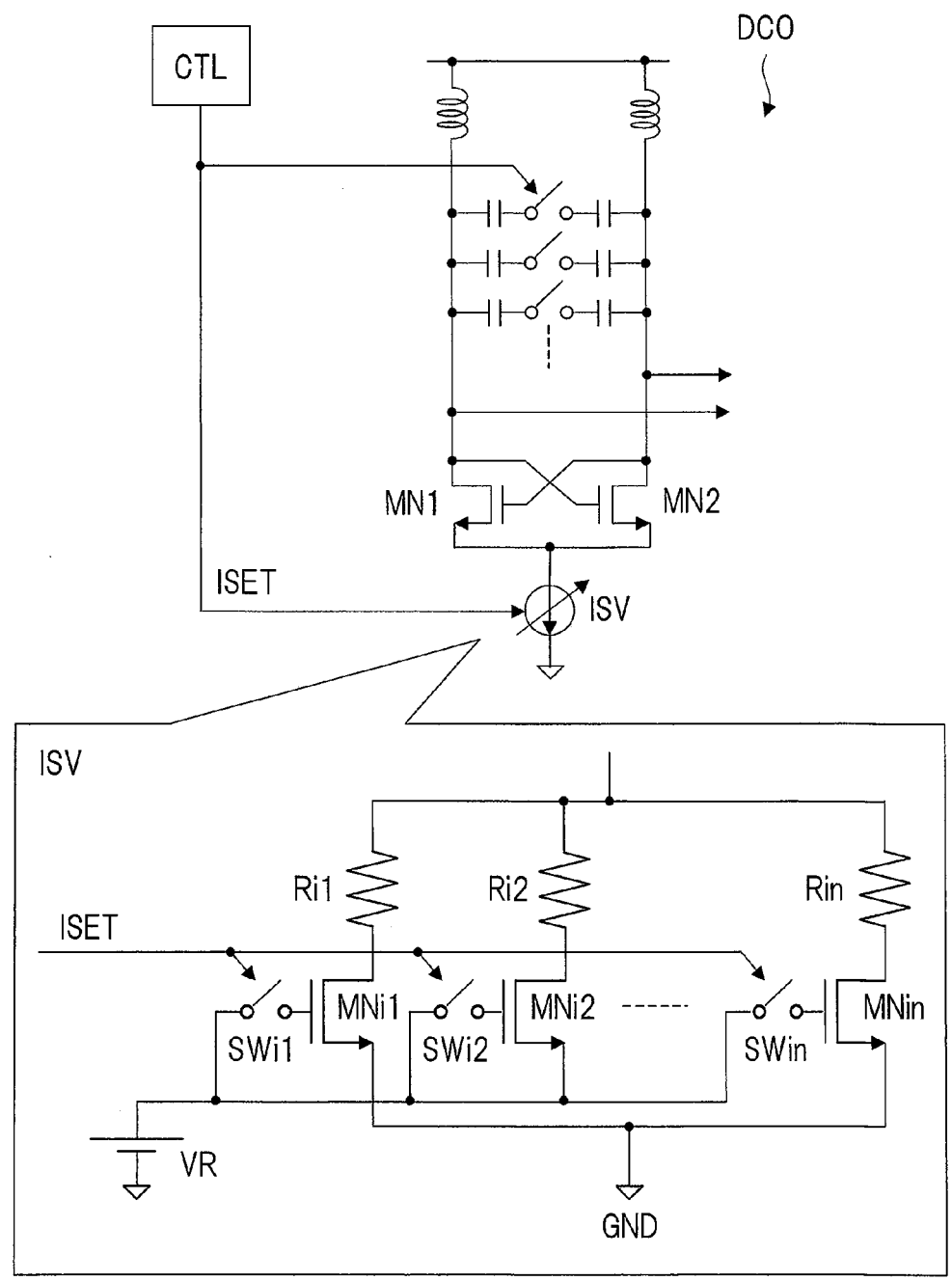
FIG. 6 is a circuit diagram illustrating a detailed configuration example of a variable current source in the oscillation circuit in FIG. 3.

FIG. 6 is a circuit diagram illustrating a detailed configuration example of a variable current source in the oscillation circuit in FIG. 3. As illustrated in FIG. 6, the variable current source ISV is composed of a plurality of direct connection circuits connected in parallel between the common source of the NMOS transistors MN1 and MN2 and the ground power supply voltage GND. Each of the direct connection circuits has a configuration in which a resistance (e.g., Ri1) and an NMOS transistor (e.g., Mi1) are sequentially connected. A fixed voltage VR is commonly supplied to the NMOS transistor (e.g., MNi1) inside each of the direct connection circuit via a switch (e.g., SWi1). Thus, by suitably controlling ON/OFF of a switch corresponding to each NMOS transistor by the bias setting signal ISET, the bias current of the oscillation circuit DCO can be variably set.

Figure 7A:
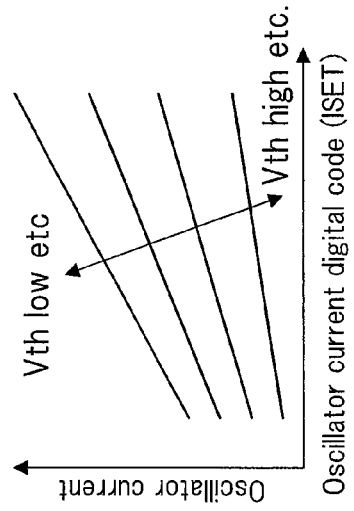
FIG. 7A is a supplemental diagram for explaining an operation of a process monitor unit in FIG. 2.
Figure 7C:
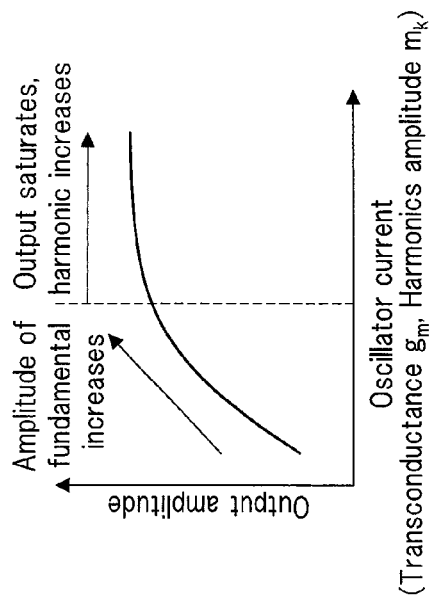
FIG. 7C is a supplemental diagram for explaining the operation of the process monitor unit in FIG. 2.
Figure 7B:
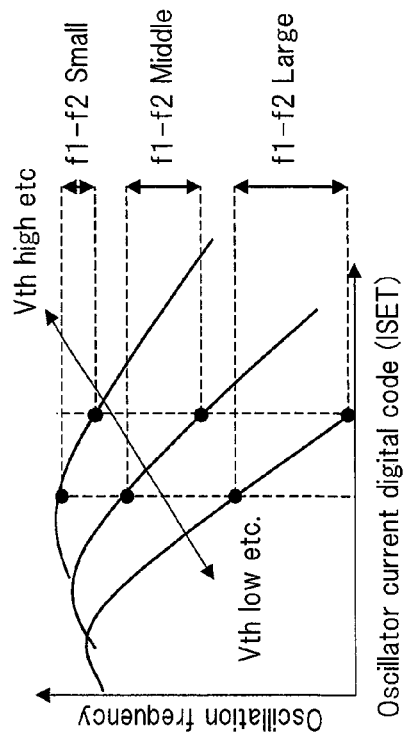
FIG. 7B is a supplemental diagram for explaining the operation of the process monitor unit in FIG. 2.

FIGS. 7A to 7D are supplemental diagrams for explaining operations of the process monitor in FIG. 2. As illustrated in FIG. 7A, in the oscillation circuit DCO as illustrated in FIG. 3, the amplitude of the oscillation output signal CKout is increased as the bias current is increased; however, the amplitude saturates at a certain point since it is limited by the power supply voltage VDD. Along with that, as illustrated in FIG. 7B, the free-run frequency of the oscillation circuit DCO increases as the increase of the oscillation output signal CKout and when the amplitude further increases and then saturates, since an increase in harmonic component affects, the free-run frequency is lowered.

FIG. 7C illustrates a relationship of the bias setting signal ISET and the bias current. Although the bias current is changed at a predetermined gradient according to the setting value (digital code) of the bias setting signal ISET, a measure of the gradient and an off-set amount of the bias current are, in practice, changed corresponding to variations of the manufacturing process (e.g., height of a threshold voltage Vth). In this manner, the saturation point of the amplitude of the oscillation output signal CKout also differs corresponding to variations of the manufacturing process. As a result, as illustrated in FIG. 7D, characteristics of the oscillation frequency to the bias setting signal ISET also differs corresponding to the variations of the manufacturing process.

Figure 7D:
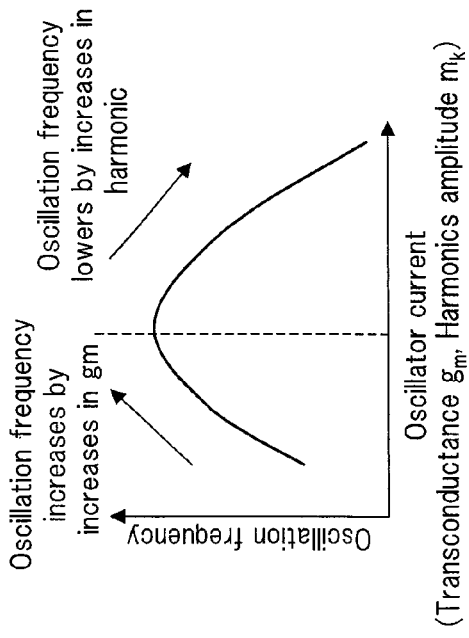
FIG. 7D is a supplemental diagram for explaining the operation of the process monitor unit in FIG. 2.
Figure 8A:
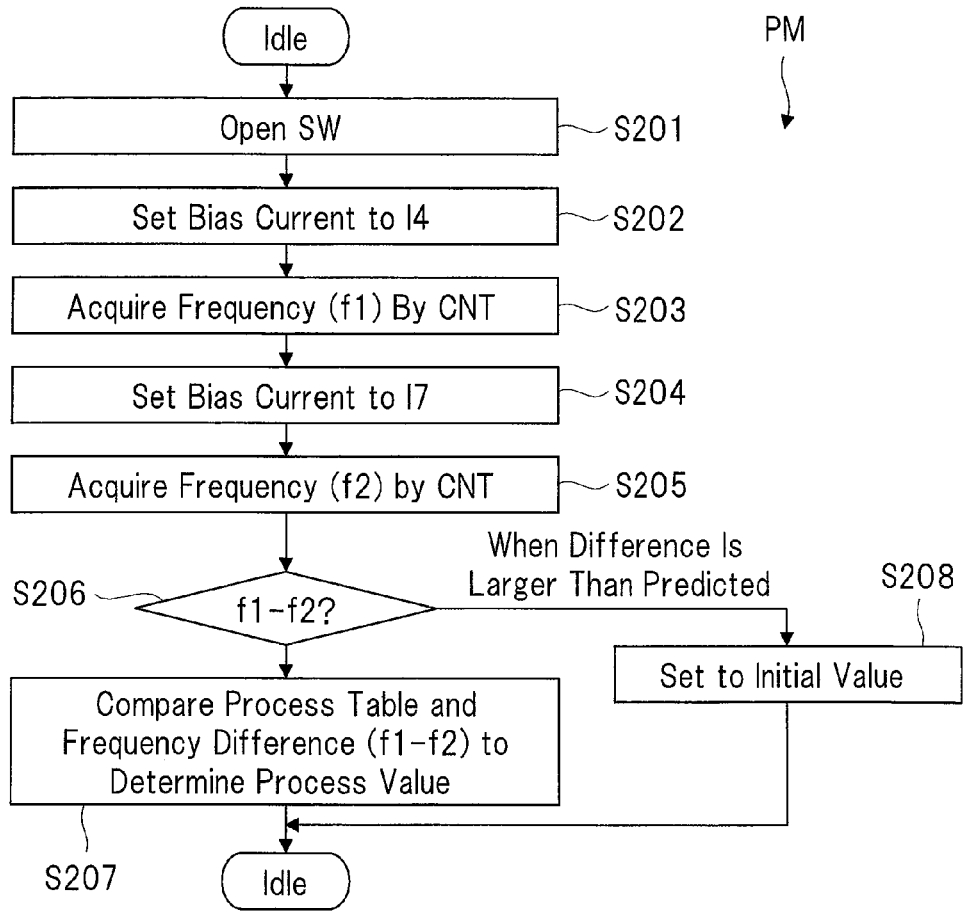
FIG. 8A is a diagram illustrating an operation example of the process monitor unit in the control circuit in FIG. 2.
Figure 8B:
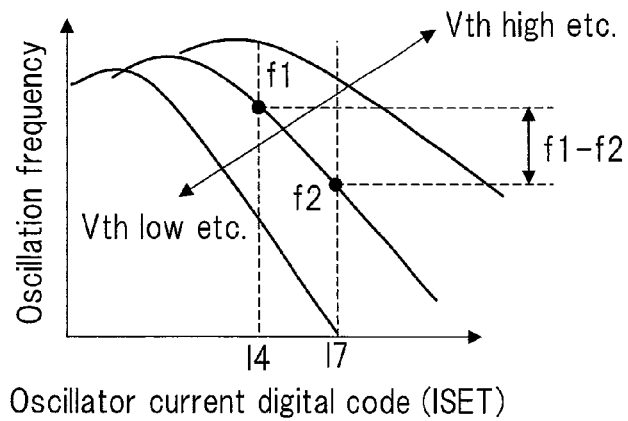
FIG. 8B is a diagram illustrating an operation example of the process monitor unit in the control circuit in FIG. 2.

Correspondingly, the process monitor unit PM in FIG. 2 determines a level of variations of the manufacturing process by discriminating differences in characteristics of the oscillation frequency corresponding to variations of the manufacturing process as illustrated in FIG. 7D. FIGS. 8A and 8B are diagrams illustrating operation examples of the process monitor unit in the control circuit in FIG. 2. As illustrated in FIG. 8A, the process monitor unit PM first detects, in a state in which the loop setting signal LPSET in FIG. 2 is at an OFF level (S201), sensitivity of frequency of the oscillation output signal CKout to a change in the bias setting signal ISET while making the counter circuit (measurement circuit) CNT measure (S202 to S206). In this example, as illustrated in FIGS. 8A and 8B, a frequency (f1) upon setting the bias current to I4 based on the bias setting signal ISET and a frequency (f2) upon setting the bias current to I7 are measured (S202 to S205) and a value of (f1−f2) is calculated (S206).

Next, the process monitor unit PM determines, based on a process table mounted in the memory circuit LUT previously in the design stage, a process value (that is, level of variations of the manufacturing process) corresponding to the calculated value of (f1−f2) (S207). Note that, when the value of (f1−f2) is larger than a predicted value, the process value is set to an initial value previously determined (S208). Note that, other various methods are conceivable for the process monitor unit PM and the method is not limited to those in FIGS. 8A and 8B as long as the level of variations of the manufacturing process can be determined.

<<Details of Problem in High-frequency Signal Processing Device (Premised Configuration)>>

Figure 28A:
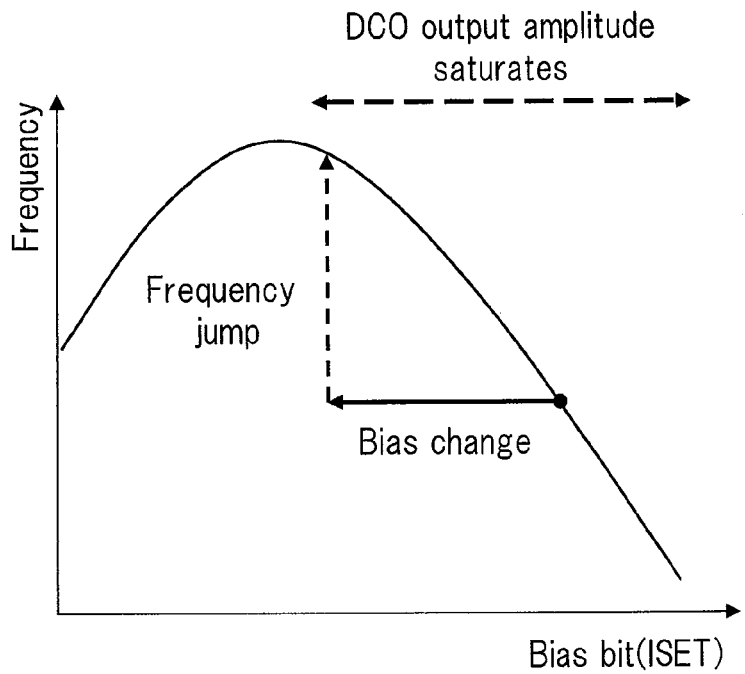
FIG. 28A is a diagram illustrating a characteristics example of oscillation frequencies (free-run frequencies) to a bias current of an LC oscillation circuit.
Figure 28B:
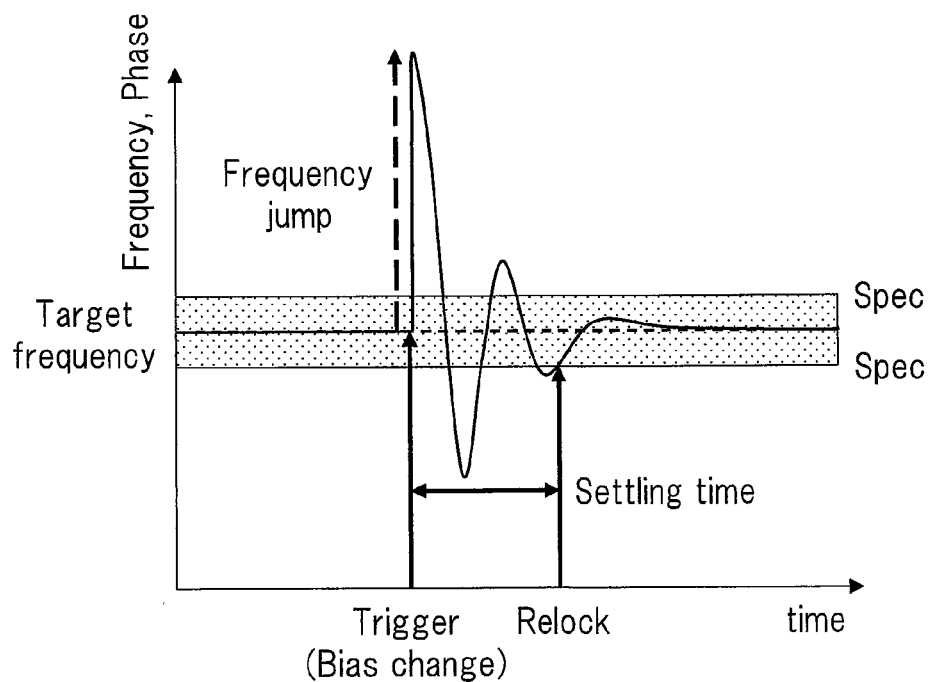
FIG. 28B is a diagram illustrating an example of a transient response upon switching bias current during locking of a PLL circuit including the LC oscillation circuit.

FIG. 28A is a diagram illustrating a characteristics example of the oscillation frequency (free-run frequency) to the bias current. FIG. 28B is a diagram illustrating an example of a transient response upon switching bias current during locking of a PLL circuit including the LC oscillation circuit. Although it has been described in FIG. 7B, when the bias current is increased, the oscillation frequency of the LC oscillation circuit is increased along with an increase in output amplitude. This is caused by a current dependency of a parasitic capacitance as described in Non-Patent Document 1. In addition, as described in Non-Patent Document 2, oscillation frequency of the logic chip LC oscillation circuit is decreased as a harmonic affects the oscillation frequency since the output amplitude saturates at a certain point when the bias current is further increased and a harmonic occurs.

Here, as illustrated in FIG. 28A, switching the bias current to a decreasing direction is assumed in a state in which the PLL is locked with a specific bias current. In this case, the oscillation frequency is greatly increased and the transient response of the oscillation frequency becomes like that illustrated in FIG. 28A as a result. For example, when the bias current value is varied by a maximum amplitude in a state in oscillation of several GHz, the oscillation frequency may be varied by several tens of MHz or more.

Since the bias current of the LC oscillation circuit is switched in a state in which the PLL is locked, the oscillation frequency is abruptly increased and the locking is temporally unlocked. Meanwhile, the PLL has a function of maintaining the oscillation frequency constant by a feedback loop and thus, as long as the amount of increase of the oscillation frequency is within a range of adjustment of a fine adjustment variable capacitor (corresponding to Cfv in FIG. 3), the oscillation frequency is reconverged to a target by adjusting the fine adjustment variable capacitor. However, specifications of a frequency (phase) error are determined per communication methods and thus the error should be back into a determined error range within a determined time. The time for reconvergence can be shortened by enhancing a loop band of the PLL. Meanwhile, enhancing the loop band frequency is not easy because there is a tradeoff between the phase error.

Figure 29:
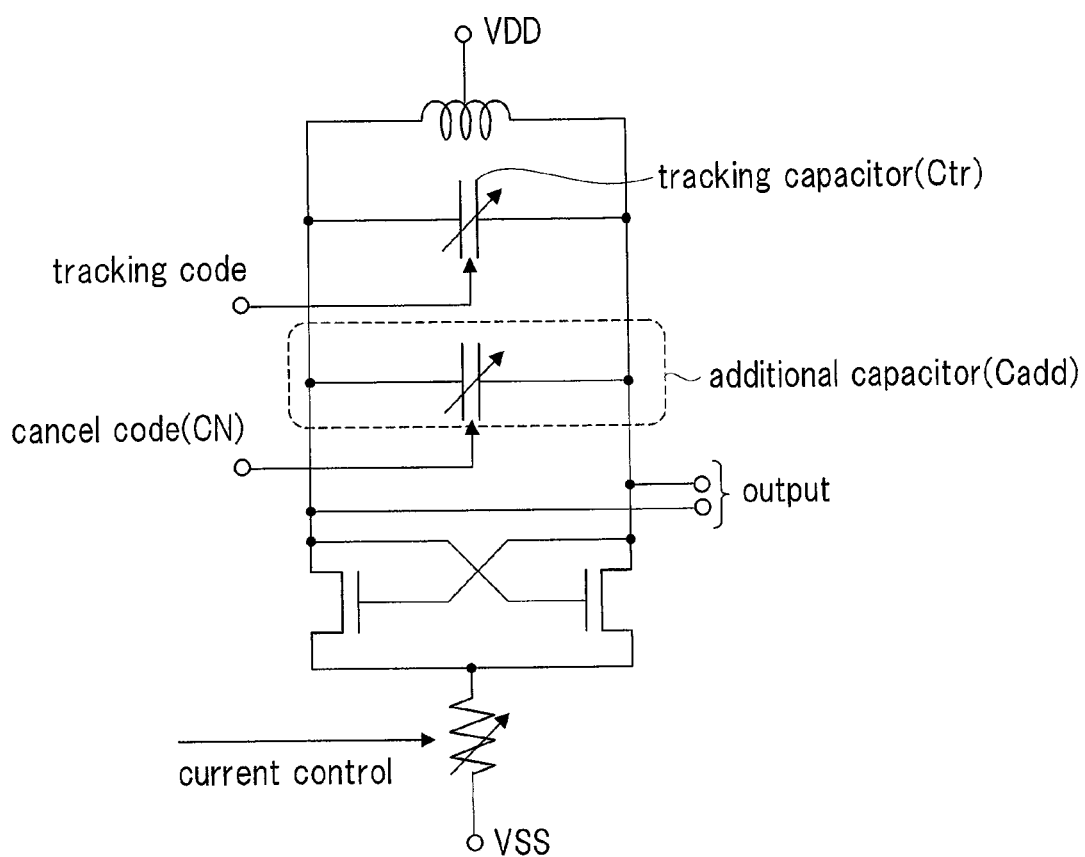
FIG. 29 is a circuit diagram illustrating a configuration example of an LC oscillation circuit studied as a premise of the present invention.

Accordingly, for example, using the method as described in Patent Document 1 is considered. FIG. 29 is a circuit diagram illustrating a configuration example of an LC oscillation circuit studied as a premise of the present invention. The LC oscillation circuit illustrated in FIG. 29 includes, in addition to a normal variable capacitor (tracking capacitor) (Ctr), an additional capacitor (Cadd). In this method, during performing calibration beforehand, the LC oscillation circuit is operated with the bias current after switching and the oscillation frequency is counted by a frequency counter. Then, the oscillation frequency is compared to a frequency before switching the bias current and a value (CN) of the capacitor (Cadd) for reducing a difference therebetween is previously searched and memorized in a table. When switching of the bias current happens during a normal operation of the PLL, the table is referred and the value (CN) of the capacitor (Cadd) is switched with switching of the bias current.

However, when such a calibration method is used, it is needed to search for a corresponding value (CN) of the capacitor (Cadd) for every selectable bias current. In this case, time required for the calibration is increased and thus power consumption required for the calibration is also increased. As a countermeasure of this, for example, reducing choices of the bias current is considered. However, in this case, optimization of bias current corresponding to transmission power is insufficient. That is, a bias current with a margin added to some extent to a minimum-required bias current is set instead of the minimum-required bias current. Further, even if the calibration is performed in consideration of temperature change, a situation requiring a complex table or a situation incapable of ensuring sufficient accuracy may occur and thus achieving the calibration itself is not easy.

In addition, in consideration of fluctuations of calibration results due to temperature change etc., it is preferable to carry out a calibration immediately before locking of the PLL. Note that, when the number of points of calibration is many, it is not easy to carry out calibration immediately before locking and thus, in practice, the calibration is carried out upon activation (or manufacturing in the factory). In that case, there is a possibility that it is impossible to deal with changes in the calibration result (temperature change, other aging degradation, etc.). Further, even if a calibration is carried out with keeping temperature changes in mind, a situation requiring a complex table, a situation incapable of ensuring sufficient accuracy, or else may happen and thus achieving the calibration itself is not easy.

Summary of Typical Embodiment

<Method 1> Switching Method of Coarse Capacitor Corresponding to Bias Current

A high-frequency signal processing device according to typical embodiment using a method 1 includes, with reference to FIGS. 2 and 3 for example, an oscillation circuit (DCO), a feedback loop circuit (FBLPU), a measurement circuit (counter circuit) (CNT), and a control circuit (CTL) carrying out first to third processings. In the first processing, the control circuit makes the measurement circuit measure in a state in which the loop setting signal (LPSET) is at an OFF level to measure a frequency of the oscillation output signal (CKout). More specifically, with reference to FIG. 13 for example, a frequency difference amount between a frequency obtained upon setting the bias setting signal (ISET) to a first bias setting value (B1) and a frequency obtained upon setting the bias setting signal (ISET) to a second bias setting value (B2) is measured.

Figure 13:
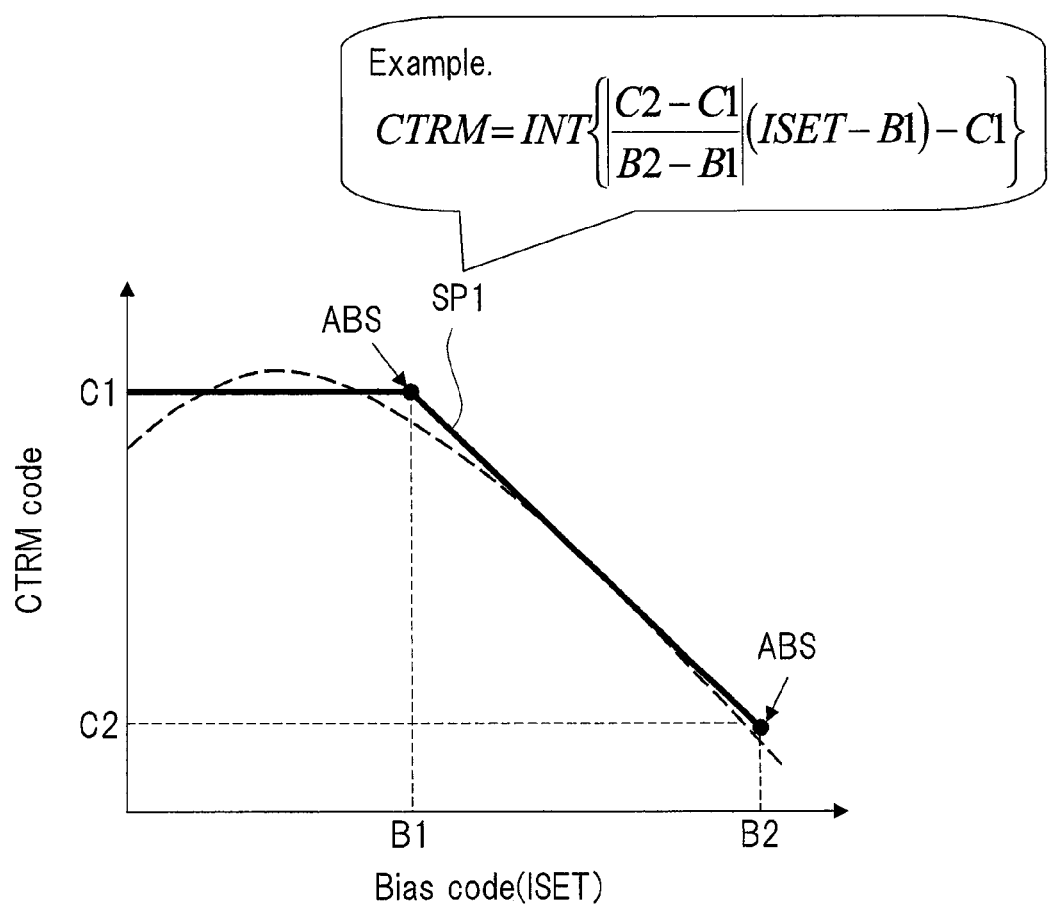
FIG. 13 is an explanatory diagram illustrating an example of an interpolant created in the flow in FIG. 12.

Next, in the second processing, with reference to FIG. 13 for example, the control circuit retains a relationship of the frequency difference amount to a variable bias amount between the second bias setting value (B2) and the first bias setting value (B1) obtained in the first processing by approximating the relationship to a linear function (SP1). Thereafter, in the third processing, the control circuit determines a changed amount of the frequency of the oscillation output signal (CKout) to a changed amount of the bias setting signal based on the linear function (SP1) upon changing the bias setting signal (ISET) in a state in which the loop setting signal (LPSET) is at an ON level and controls the first frequency setting signal (CTRM) based on this.

In what range the oscillation circuit uses the bias current in practice is determined by an application for using the high-frequency signal processing device. Here, with reference to FIG. 11 for example, upon using the bias current in a region (AG2) over a saturation point of an output amplitude, the relationship of the bias current and the oscillation frequency is substantially linear. Thus, when the calibration (first processing) is carried out at two points of the bias current, the relationship of the bias current and the oscillation frequency (that is, the bias current and the first frequency setting signal (CTRM)) can be obtained by interpolation. In addition, since using in a region not over the saturation point of the output amplitude also exhibits a substantially linear relationship, calibration is performed at two points of the bias current. Further, when using the bias current in a region around start of saturation of the output amplitude (around the turning point), since frequency fluctuation is originally small and control of the first frequency setting signal (CTRM) corresponding to switching of the bias current is not needed, calibration can be omitted.

When these points are utilized, by controlling the first frequency setting signal (CTRM) based on a result of the calibration (that is, first and second processings) upon switching the bias current (upon the third processing), abrupt frequency fluctuations along with switching of the bias current can be suppressed and time for reconvergence can be shortened. In addition, time required for the calibration can be greatly shortened. Note that, with reference to FIG. 11 for example, the relationship of the oscillation frequency and the bias current is, in practice, varies due to variations of the manufacturing process and thus the first and second bias setting value that is optimum (that is, linear interpolation by linear function can be used) may vary accordingly. Accordingly, it is preferable to grasp variations of the manufacturing process previously by the process monitor unit as illustrated in FIGS. 8A and 8B.

Figure 15:
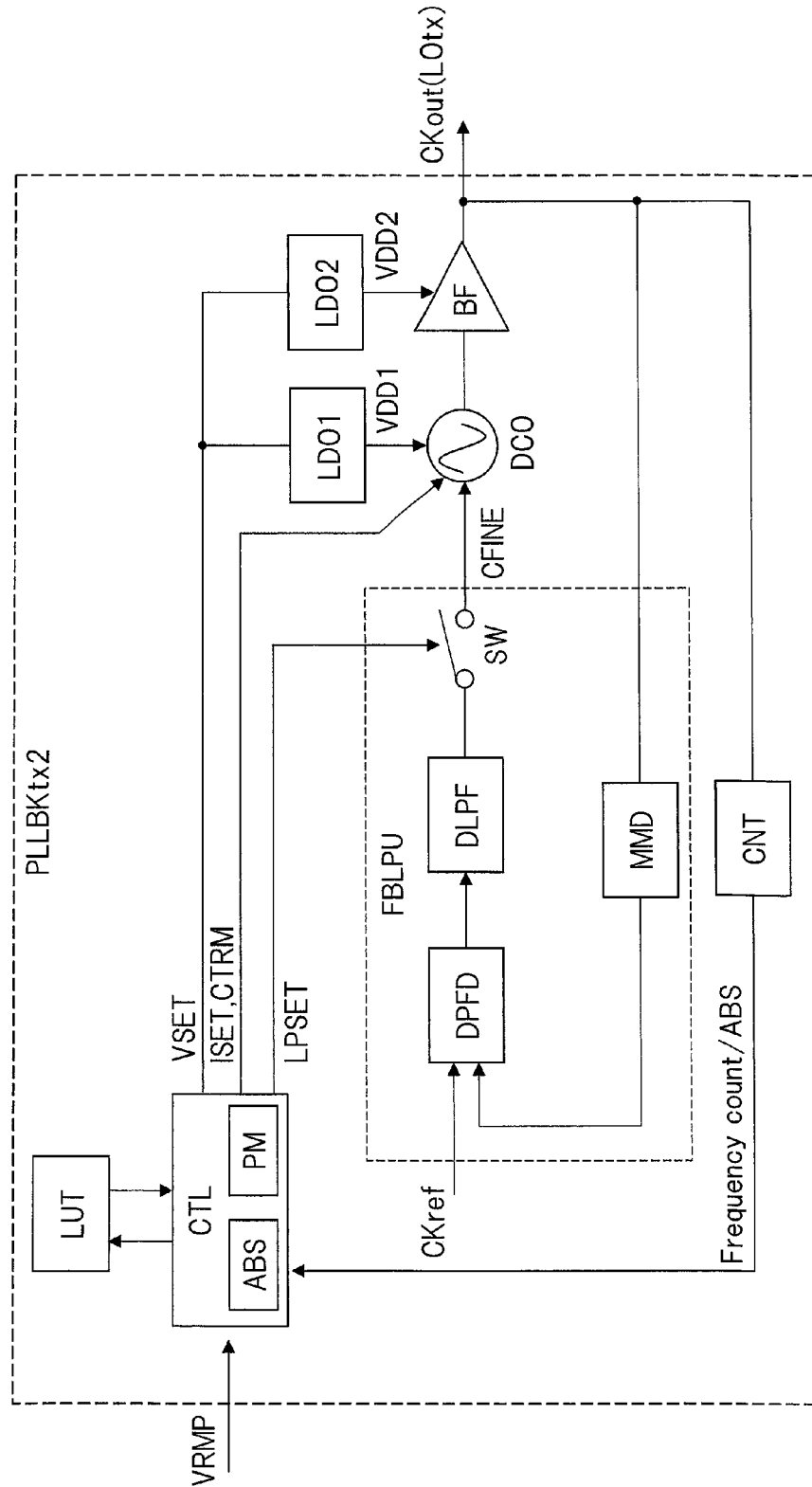
FIG. 15 is a block diagram illustrating a detailed configuration example of a transmission PLL block in a high-frequency signal processing device according to a third embodiment.
Figure 16A:
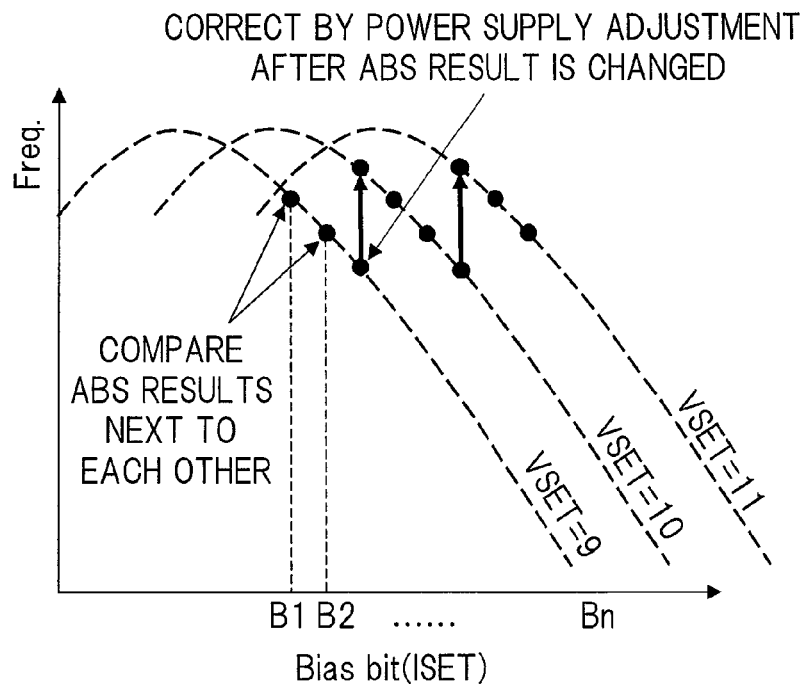
FIG. 16A is a schematic diagram illustrating an example of an operation principle of the high-frequency signal processing device according to the third embodiment of the present invention.
Figure 16B:
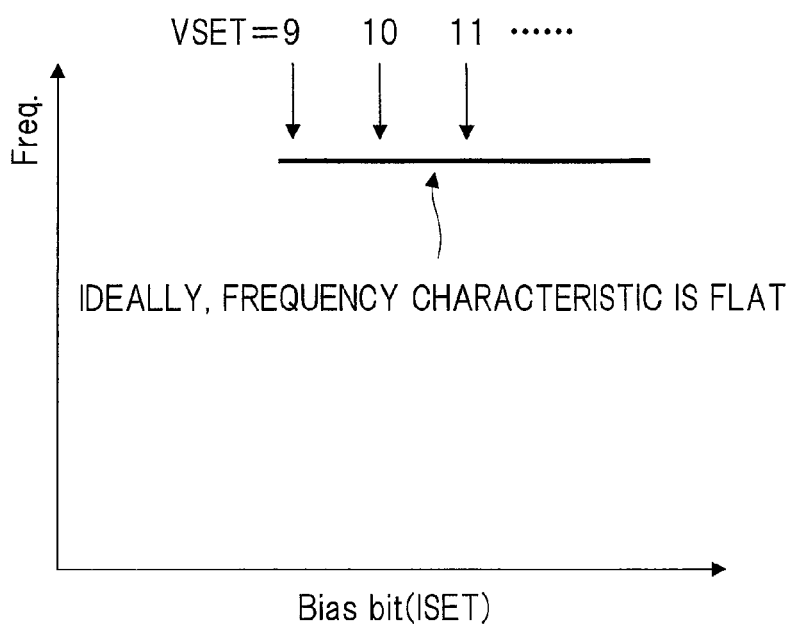
FIG. 16B is a schematic diagram illustrating an example of an operation principle of the high-frequency signal processing device according to the third embodiment of the present invention.
Figure 19:
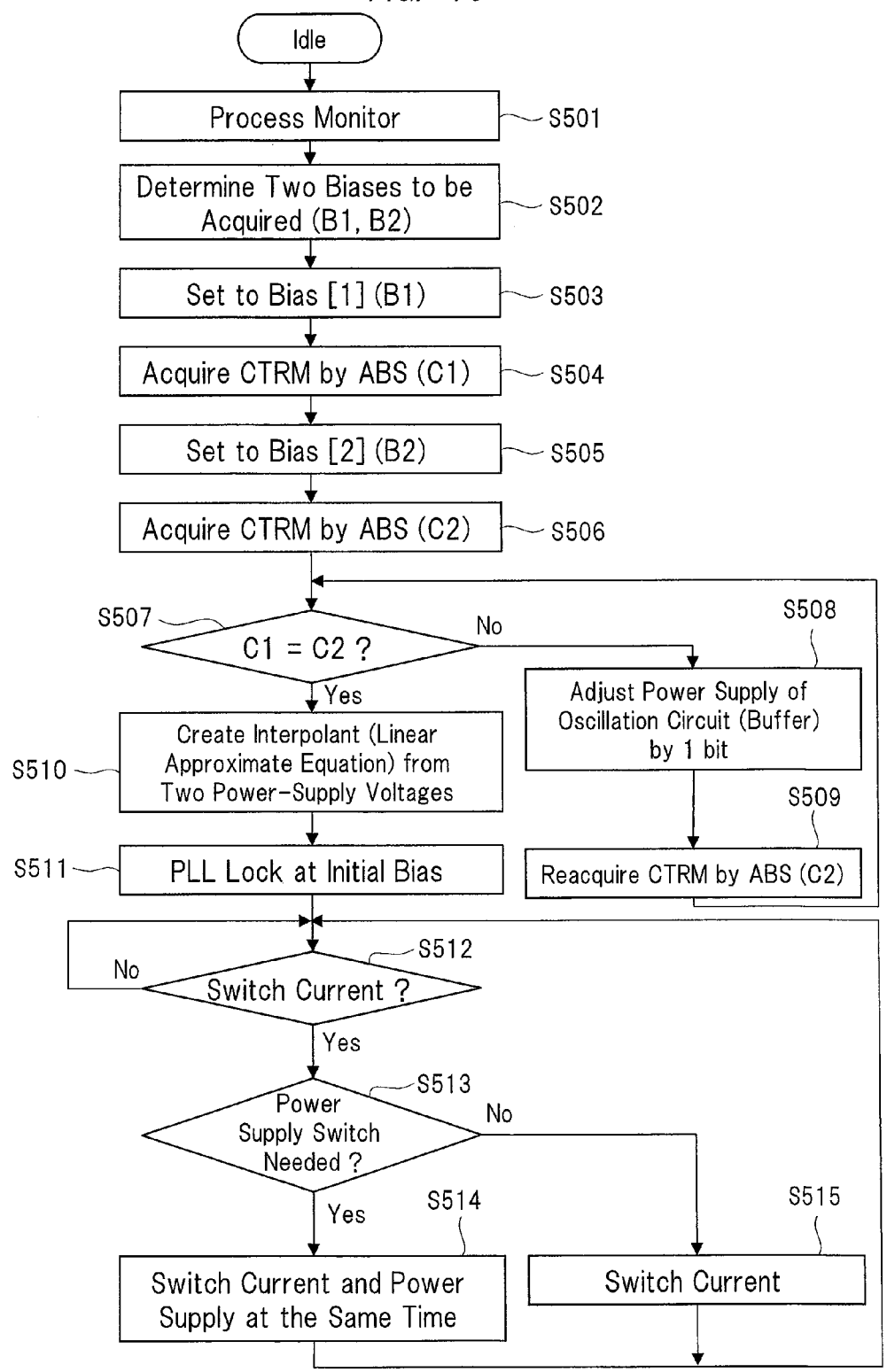
FIG. 19 is a glow chart illustrating an example of detailed processing contents of a control circuit in FIG. 15 in a high-frequency signal processing device according to a fourth embodiment of the present invention.

<Method 2> Method of Switching Power Supply Voltage Corresponding to Bias Current Another high-frequency signal processing device according to a typical embodiment using a method 2 includes, with reference to FIGS. 3 and 15 for example, an oscillation circuit (DCO), a buffer circuit (BF), power supply circuits (LDO1, LDO2), a feedback loop circuit (FBLPU), a measurement circuit (counter circuit) (CNT), an control circuit (CTL) for carrying out first to third processings. In the first processing, the control circuit makes the measurement circuit measure in a state in which a loop setting signal (LPSET) is at an OFF level, as illustrated in FIGS. 16A, 16B and 19 for example, to search for a relationship of a bias setting signal (ISET) and a power supply voltage setting signal (VSET) for setting a power supply voltage (VDD1 and/or VDD2).

More specifically, the control circuit measures a frequency difference amount between a frequency of an oscillation output signal (CKout) obtained upon setting the power supply voltage setting signal and a bias setting signal to a first voltage setting value (VSET=xx) and a first bias setting value (B1), respectively, and a frequency of the oscillation output signal obtained upon setting the power supply voltage setting signal and a bias setting signal to a second voltage setting value (VSET=yy) and a second bias setting value (Bn), respectively. Then, the control circuit search for the second voltage setting value so that the frequency difference value is within a predetermined range (more specifically, gets closer to zero).

Next, in the second processing, the control circuit retains a relationship of a variable bias amount between the second bias setting value and the first bias setting value obtained in the first processing and a variable voltage value between the second voltage setting value and the first voltage setting value. Thereafter, in the third processing, in a state in which the loops setting signal (LPSET) is at an ON level, the control circuit determines a variable voltage amount to a changed amount of the bias setting signal upon changing the bias setting signal based on the relationship retained in the second processing and controls the power supply voltage signal based on the variable voltage amount.

In this manner, in the method 2, by flatten the characteristics of the oscillation frequency to the bias current by adjusting the power supply voltage, abrupt frequency fluctuation along with switching of the bias current is suppressed, so that the time for reconvergence is shortened. As described in Non-Patent Document 2, it has been found out that lowering of the oscillation frequency along with an increase in the bias current when the output amplitude of the oscillation circuit is being saturated is caused by an increase of harmonic due to power supply clipping. Thus, when using a bias current in a region in which the output amplitude is saturated, by also increasing the power supply voltage of the oscillation circuit (and/or buffer circuit) in harmony with an increase in the bias current, occurrence of harmonic can be suppressed and fluctuation of the oscillation frequency can be small.

An optimum power supply voltage here is stored in a table after a calibration is previously performed using the first and second processings. Then, upon a normal operation (that is, when the loop setting signal (LPSET) is at an ON level), based on the table, the power supply voltage is switched along with switching of the bias current. Note that, when performing the calibration, for example, in the same manner as method 1, a value of an optimum power supply voltage is searched for by two bias currents so that a relationship of the bias current and the optimum power supply voltage can be obtained by interpolation (by an approximation formula using a linear function). In this manner, time required for calibration can be greatly shortened. Note that, when using the method 2, a calibration to the first frequency setting signal (CTRM) is not needed like the method 1.

<Method 3> Method of Switching Coarse Capacitance Power Supply Voltage Corresponding to Bias Current [1]

Another high-frequency signal processing device according to a typical embodiment using a method 3 is for a control circuit to carry out operations same as the method 1 using the same configuration as the method 2. In the method 3, to further improve calibration accuracy, previously to the first processing of the method 1, it is preferable to carry out the processing using the process monitor unit (PM) as illustrated in, for example, FIGS. 8A and 8B. The control circuit determines an off-set amount corresponding to a level of variations of the manufacturing process obtained by the processing based on a process table previously determined in the design stage to previously compensate variations of the manufacturing process by adding the off-set amount to the bias setting signal.

In addition, to achieve temperature compensation, with reference to FIG. 1 for example, the temperature sensor (TMP) is provided. The control circuit determines a voltage setting value of the power supply setting signal (VSET) for compensating temperature based on a temperature compensation table previously mounted in the design stage, and carries out the first processing of the method 1 in a state in which the power supply setting signal is controlled based on the determined voltage setting value. That is, in a state in which both the manufacturing process and temperature are compensated, the first processing of the method 1 is carried out.

In this manner, the calibration to the first frequency setting signal (CTRM) can be more accurately carried out. By the improvement in accuracy of the calibration, abrupt frequency fluctuation along with switching of the bias current can be further suppressed and the time for reconvergence can be shortened. Further, since variations of the manufacturing process are compensated by the bias current and temperature is compensated by the power supply voltage, for example, as compared to compensating variations of the manufacturing process and temperature by one variable, easier compensation can be achieved. Note that, upon the third processing of the method 1 (that is, normal operation), the control circuit controls the first frequency setting signal (CTRM) based on the relationship in the second processing together with the switching of the bias current, and further controls the power supply setting signal with reference to the temperature compensation table based on temperature at the stage of switching the bias current. In this manner, even when a temperature change occurs in the normal operation, it is needless to carry out a calibration again and thus it is possible to achieve shortening of the time for calibration as a result.

<Method 4> Method of Switching Coarse Capacitance and Power Supply Voltage Corresponding to Bias Current [2]

Another high-frequency signal processing device according to a typical embodiment using a method 4 carries out a calibration like a combination of those of the methods 1 and 2 by a control circuit using the same configuration as the method 2. The control circuit search for and retains a relationship of a variable bias amount and a variable voltage amount by a calibration like the method 2. Further, the control circuit search for and retains a relationship of the variable bias amount and a frequency difference amount by a calibration like the method 1 in a state in which the power supply setting signal (CSET) is controlled based on the relationship of the variable bias amount ad the variable voltage amount. By carrying out the calibration using both the coarse capacitance and the power supply voltage, a higher accuracy of calibration may be achieved.

Hereinafter, more details of the high-frequency signal processing device using respective methods will be described.

First Embodiment

In a first embodiment, details of the high-frequency signal processing device using the method 1 described above will be described. The high-frequency signal processing device according to the first embodiment includes a transmission PLL block PLLBKtx1 illustrated in FIG. 2 and controls the coarse adjustment capacitance setting signal (first frequency setting signal) CTRM corresponding to switching of a bias current of the oscillation circuit DCO to suppress abrupt frequency fluctuations along with the switching of the bias current. First, an operation principle upon suppressing such abrupt frequency fluctuations will be described.

Figure 9:
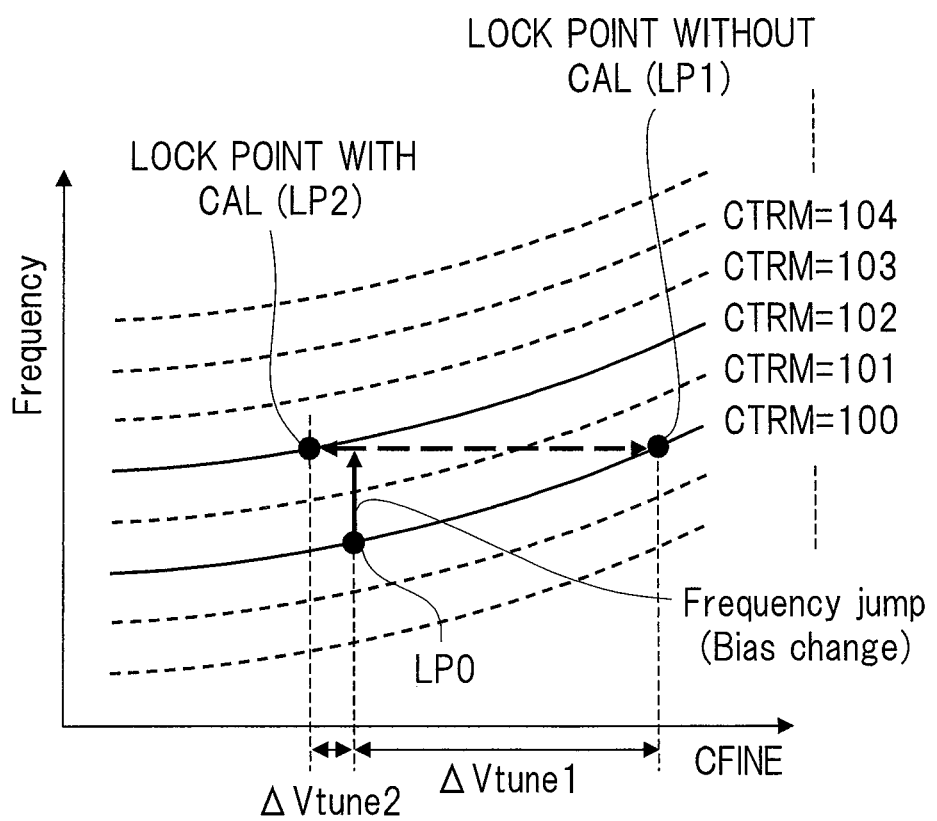
FIG. 9 is a schematic diagram illustrating an example of an operation principle of a high-frequency signal processing device according to a first embodiment of the present invention.

FIG. 9 is a schematic diagram illustrating an example of the operation principle of the high-frequency signal processing device according to the first embodiment. In FIG. 9, an example of oscillation frequency characteristics to the coarse adjustment capacitance setting signal CTRM and the fine capacitance setting signal CFINE is illustrated. In FIG. 9, for example, assumed is as state in which the coarse adjustment capacitance setting signal CTRM is 100 and the fine capacitance setting signal CFINE is operated at a lock point LPO. In this state, when the bias current of the oscillation circuit DCO is switched, the transmission PLL block PLLBKtx1 in FIG. 2 performs feedback control so as to cancel out the frequency fluctuations along with the switching of the bias current.

Here, if switching of the coarse adjustment capacitance setting signal CTRM is not performed, as illustrated in FIG. 9, the fine capacitance setting signal CFINE is greatly varied so as to cancel out the frequency fluctuations along with the switching of the bias current and reconverges to a lock point 1 after being varied only by ΔVtune1. In the PLL block, the fine capacitance setting signal CFINE is varied in accordance with integral control via the loop filter circuit DLPF and thus time is needed to some extent until the fine capacitance setting signal CFINE reaches the lock point LP1 when ΔVtune1 is large; thus, in a transient period of the fine capacitance setting signal CFINE, the frequency is greatly shifted from a target frequency. Also, when ΔVtune1 is very large, reconvergence itself may be difficult.

Meanwhile, when switching the coarse adjustment capacitance setting signal CTRM, as illustrated in FIG. 9, by switching the coarse adjustment capacitance setting signal CTRM from 100 to 102 for example, a large part of the frequency fluctuations along with the switching of the bias current is canceled out by the switching of the coarse adjustment capacitance setting signal CTRM. As a result, a varied width (ΔVtune2) of the fine capacitance setting signal CFINE until the coarse adjustment capacitance setting signal CTRM reached a lock point LP2 after reconvergence can be very small. Since ΔVtune2 is small, time for fine capacitance setting signal CFINE to reach the lock point LP2 is short and a shifted width of the frequency in the transient period from the target frequency is small.

Figure 10A:
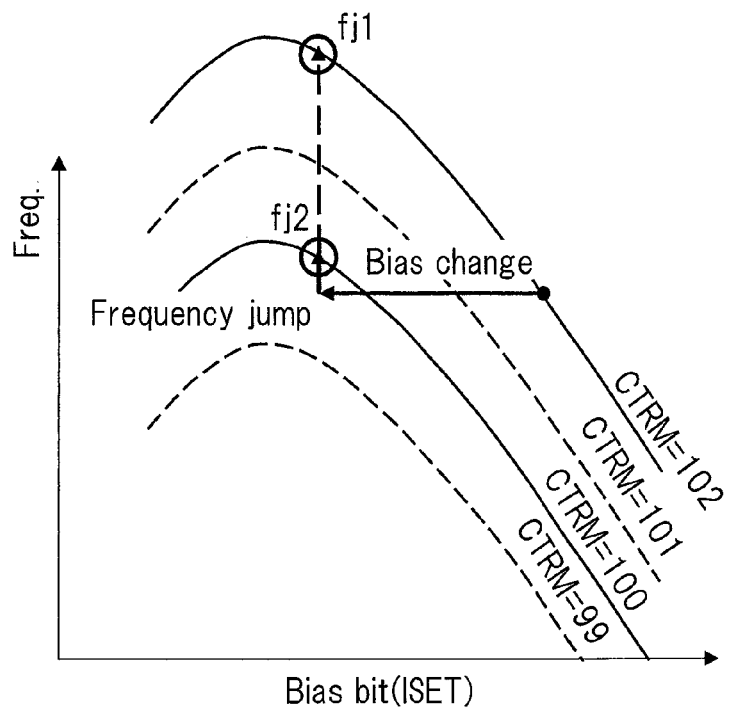
FIG. 10A is a schematic diagram illustrating an example of an action of the high-frequency signal processing device according to the first embodiment of the present invention.
Figure 10B:
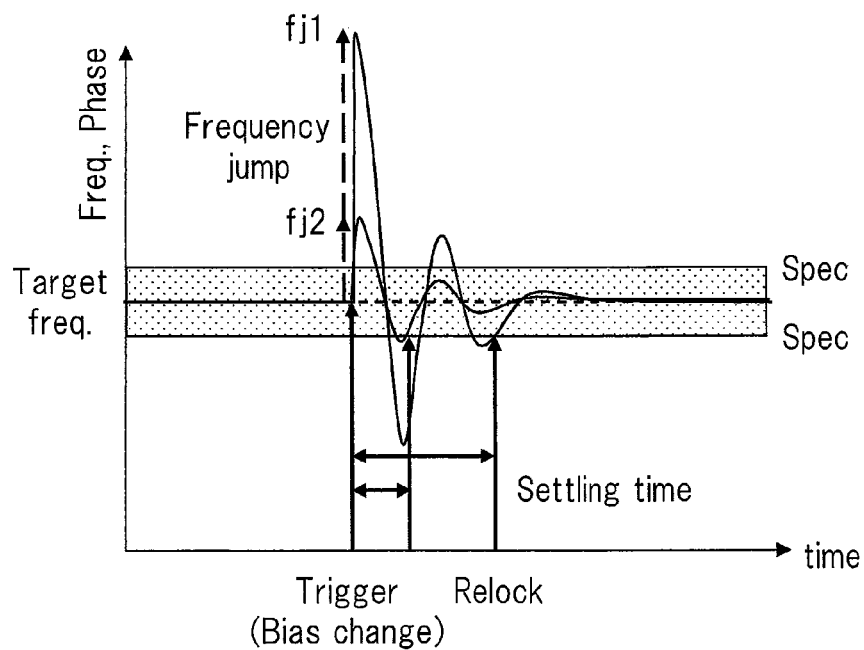
FIG. 10B is a schematic diagram illustrating an example of an action of the high-frequency signal processing device according to the first embodiment of the present invention.

FIGS. 10A and 10B are schematic diagrams illustrating an example of an action of the high-frequency signal processing device according to the first embodiment. In FIG. 10A, assumed is a case of switching the bias setting signal ISET in a state in which the coarse adjustment capacitance setting signal CTRM is set to 102. In this case, when the coarse adjustment capacitance setting signal CTRM is kept at 102, the frequency greatly varies at the very moment of switching the bias setting signal ISET and corresponding to this, as illustrated in FIG. 10B, a time until reconvergence with in a predetermined range of target frequency (so-called settling time) is also increased. Meanwhile, as illustrated in FIG. 10A, when the coarse adjustment capacitance setting signal CTRM is switched to 100 for example, frequency fluctuations at the very moment of switching the bias setting signal ISET are suppressed and corresponding to this, as illustrated in FIG. 10B, the settling time can be also shortened.

FIG. 11 is a schematic diagram illustrating an example of oscillation frequency characteristics to the bias setting signal including variations of the manufacturing of the high-frequency signal processing device according to the first embodiment of the present invention. As illustrated in FIG. 11, the oscillation frequency characteristics to the bias setting signal ISET exhibits a characteristics curve in an angle shape and a bias setting value of the bias setting signal ISET corresponding to a turning point of the angle varies corresponding to variations of the manufacturing process (SS characteristics, TYP characteristics, FF characteristics). The SS characteristics corresponds to a case of having a high threshold voltage of a MOS transistor compared to the TYP characteristics, and the FF characteristics corresponds to a case of having a low threshold voltage of a MOS transistor compared to the TYP characteristics. For example, when the bias setting signal ISET is set to a certain value, correspondingly, the bias current is more difficult to flow with the SS characteristics than the TYP characteristics and thus a saturation point in the output amplitude (that is, turning point) is varied to a side of larger bias setting value of the bias setting signal ISET.

In FIG. 11, when a variable range of the bias setting signal ISET is a region over the saturation point (that is, turning point) of the output amplitude, a relationship of the bias setting signal ISET and the oscillation frequency is substantially linear. In addition, also when the variable range of the bias setting signal ISET is a region not over the saturation point of the output amplitude, in the same manner, the relationship of the bias setting signal ISET and the oscillation frequency is substantially linear. Further, when the variable range of the bias setting signal ISET is a region (AR1) around saturation of the output amplitude (around the turning point), approximately, it can be regarded such that there is no fluctuations of the oscillation frequency to the bias setting signal ISET.

Figure 12:
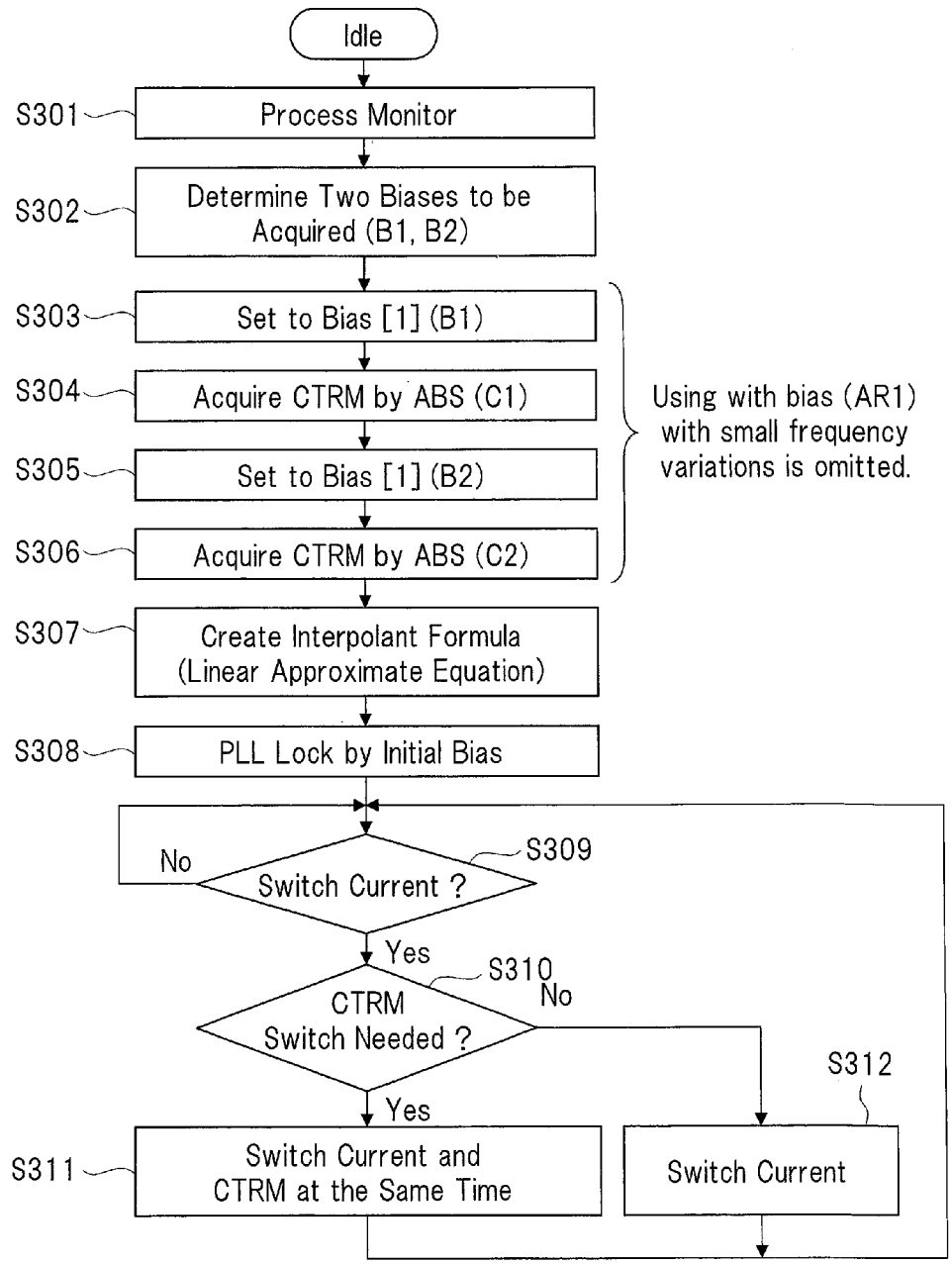
FIG. 12 is a flow chart illustrating an example of detailed processing contents of the control circuit in FIG. 2 in the high-frequency signal processing device according to the first embodiment.

FIG. 12 is a flow chart illustrating an example of detailed processing contents of the control circuit in FIG. 2 of the high-frequency signal processing device according to the first embodiment of the present invention. FIG. 13 is an explanatory diagram illustrating an example of an interpolant created in the flow in FIG. 12. As illustrated in FIG. 12, the control circuit CTL determines a shape of the angle of the oscillation frequency characteristics to the bias setting signal ISET using the process monitor unit PM as illustrated in FIGS. 8A and 8B (S301). Here, an example of a case in which variations of the manufacturing process are determined to have the TYP characteristics in FIG. 11 by the process monitor unit PM, and further, an example in which the variable range of the bias setting signal ISET is a region (AR1 in FIG. 11) over the saturation point of the output amplitude (that is, tuning point) and around the turning point are taken.

Subsequently, the control circuit CTL determines two bias setting values (B1, B2) of an optimum bias setting signal ISET based on the variations of the manufacturing process (here, the TYP characteristics) (S302). The optimum bias setting value of the bias setting signal ISET means a bias setting value of both ends of the linear region (AR2) in FIG. 11. Subsequently, the control circuit CTL sets one of the bias setting values (B1) and acquires an optimum value (C1) of the coarse adjustment capacitance setting signal (first frequency setting signal) CTRM using the automatic band selector unit ABS as illustrated in FIG. 5. In the same manner, the control circuit CTL sets the other one of the bias setting values (B2) and acquires an optimum value (C2) of the coarse adjustment capacitance setting signal CTRM using the automatic band selector unit ABS (S303 to S306).

In the steps, the automatic band selector unit ABS functions as a measurement circuit of the oscillation frequency. For example, when the coarse adjustment capacitance setting signal CTRM to be optimum upon setting the oscillation frequency to a target frequency with the bias setting value B1 is C1 and the coarse adjustment capacitance setting signal CTRM to be optimum upon setting the oscillation frequency to the target frequency with the bias setting value B2 is C2, it means that C1 is changed to C2 so as to cancel out a frequency different amount generated by a variable bias amount between B1 and B2. This means that the frequency difference amount generated by the variable bias amount is measured by a difference amount of the setting values of the coarse adjustment capacitance setting signal CTRM between C1 and C2.

Note that the processings of S303 to S306 may be processing of directly measuring an oscillation frequency to each of the bias setting values (B1, B2) using the counter circuit (measurement circuit) CNT in FIG. 2. However, the method of the first embodiment is aimed at obtaining an optimum value of the coarse adjustment capacitance setting signal CTRM and thus it is more effective to use a processing of making the counter circuit CNT measure via the automatic band selector unit ABS to acquire a measurement result of frequency of the measurement as the setting value of the coarse adjustment capacitance setting signal CTRM.

Subsequently, in FIG. 12, the control circuit CTL retains a relationship of the variable bias amount (B2–B1) and the optimum values of the coarse adjustment capacitance setting signal CTRM (C2–C1) mentioned above to the memory circuit LUT in FIG. 2 as an interpolant (approximation formula of linear function) (S307). That is, the characteristics of the linear region (AR2) in FIG. 11 is expressed by an interpolant (approximation formula of linear function) SP1 as illustrated in FIG. 13. Although the interpolant SP1 is not limited to this, it can be defined as Equation 1 taking INT a closest integer value.

$$CTRM = INT\{(C2-C1)/(B2-B1)|\cdot(ISET-B1)-C1\} \quad \text{Equation 1}$$

Note that, in the memory device LUT, the interpolant may be retained as it is or a result obtained from the interpolant (that is, a discrete value of the bias setting signal ISET and the coarse adjustment capacitance setting signal CTRM) may be retained as an optimum coarse adjustment capacitance prediction table. In the former case, a memory capacity of the memory circuit LUT can be reduced; and in the latter case, since there is no need to carry out a sequential calculation upon switching the bias setting signal ISET, an optimum value of the coarse adjustment capacitance setting signal CTRM can be quickly defined.

Next, in FIG. 12, the control circuit CTL locks the PLL with an initial bias value of the bias setting signal ISET, resulting in a normal operation state (S308). Thereafter, the control circuit CTL switches the coarse adjustment capacitance setting signal CTRM together with the bias setting signal ISET when switching of the coarse adjustment capacitance setting signal CTRM is needed, and when the switching is not needed, switches the bias setting signal ISET (S311 to S312)

Note that, when the variable range of the bias setting signal ISET is the region around the turning point in FIG. 11, since the frequency fluctuation is small, the control circuit CTL takes it as there is approximately no frequency fluctuation as illustrated in FIG. 13, and does not switch the coarse adjustment capacitance setting signal CTRM. As the case may be, by designing that the bias setting signal ISET is used only in this region, while the variable range of the bias setting signal ISET is reduced (as a result, reduction of power consumption of the PLL becomes difficult), the calibration as described in S301 to S307 itself can be omitted and activation of the PLL can be faster.

Figure 14:
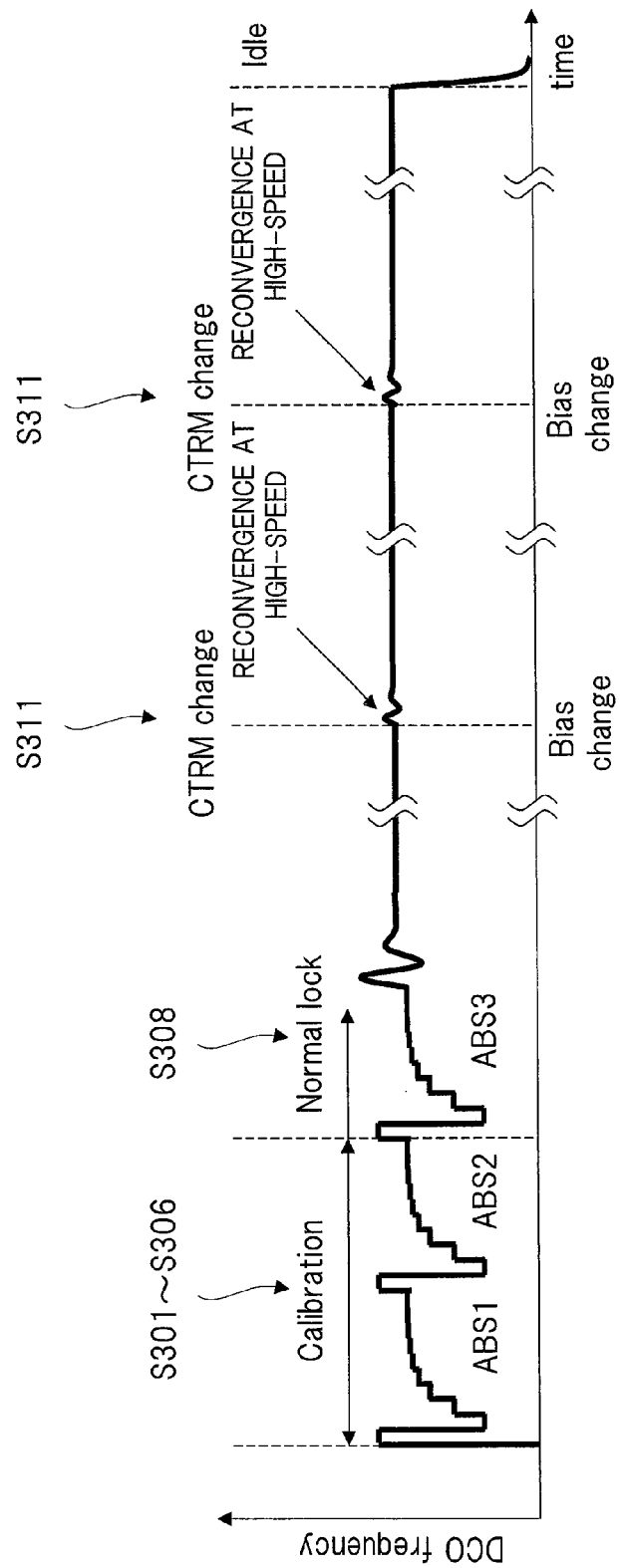
FIG. 14 is a schematic diagram illustrating a time-series operation example of a transmission PLL block to which the process of FIG. 12 is used.

FIG. 14 is a schematic diagram illustrating a time-series operation example of the transmission PLL block to which the processing of FIG. 12 is used. As illustrated in FIG. 14, upon activating the transmission PLL block PLLBKtx, first, along with the processing of S301 to S306 in FIG. 12, the processing by the automatic band selector unit ABS is carried out at least twice (ABS1, ABS2). Next, by the processing of S308 in FIG. 12, the processing of the automatic band selector unit ABS along with normal locking of the transmission PLL block PLLBKtx is carried out. Thereafter, by the processing of S311 in FIG. 12, switching of the coarse adjustment capacitance setting signal CTRM is carried out each time switching of the bias setting signal ISET is made.

In the foregoing manner, by using the high-frequency signal processing device of the first embodiment, for example, the following effects are achieved. First, upon switching the bias setting signal ISET described in S311 in FIG. 14, since the switching of coarse adjustment capacitance setting signal CTRM is carried out together, as described with reference to FIGS. 9, 10A and 10B, an abrupt fluctuation of the oscillation frequency along with the switching of the bias setting signal ISET is suppressed and shortening of the settling time can be achieved.

Further, time for the calibration corresponding to S301 to S306 in FIG. 14 (in other words, activating time of the PLL) can be shortened. That is, when using the method like Patent Document 1, in the processing of S301 to S306, it is needed to carry out the processing by the automatic band selector unit ABS for the times same as the number of choices of the bias setting signals ISET. However, in the first embodiment, by using an interpolant as described in FIG. 13, the processing by the automatic band selector unit ABS is only necessary to be carried out for several times (for example, twice). The processing by the automatic band selector unit ABS may need 25 μs per one time of the processing, by reducing the number of times of the processing, the time for calibration can be greatly shortened. As a result, the number of choices of the bias setting signals ISET can be easily increased and a further reduction of power consumption of the high-frequency signal processing device can be achieved.

Note that, the processing of the process monitor unit PM in S301 in FIG. 12 is only necessary to be capable of determining variations of the manufacturing process and it is not necessarily limited to the processing in FIGS. 8A and 8B.

Second Embodiment

In a second embodiment, a limitation example of the high-frequency signal processing device of the first embodiment described above will be described. The high-frequency signal processing device of the second embodiment has the same configuration and operations as the high-frequency signal processing device of the first embodiment, and the processing of the process monitor unit PM is limited to that in FIGS. 8A and 8B.

When the process monitor unit PM carries out the processing in FIGS. 8A and 8B, at the stage of the processing of S301 in FIG. 12, the measurement of oscillation frequency is carried out to two points of the bias current (14 and 17 in FIG. 8B). For example, based on a measurement result from the two points of the bias current, variations of the manufacturing process is determined to have the TYP characteristics in FIG. 11, and further, when the two points of the bias current are set to two ends of the linear region (AR2) in FIG. 11 (that is, the bias setting values B1 and B2 in FIG. 13), the processing of S303 to S306 in FIG. 12 can be omitted.

More specifically, since the processing of calibration of S303 to S306 in FIG. 12 is shared with the processing of the process monitor unit PM of S301, the time required for the calibration is substantially zero. Note that, even if the variations of the manufacturing process have the SS characteristics or FF characteristics in FIG. 11, by adding one point of the bias current for measuring the oscillation frequency, the relationship of the bias setting signal ISET and the coarse adjustment capacitance setting signal (first frequency setting signal) CTRM can be defined by an interpolation. For example, in FIG. 8B, in the case of the SS characteristics (threshold voltage Vth is high), it is only necessary to add measurement at one point of the bias current on the right side of I7; and in the case of the FF characteristics, it is only necessary to add measurement at one point of the bias current on the left side of I4.

In this manner, as compared to the case of using a process monitor unit for carrying out a different processing than that of FIGS. 8A and 8B, time required for the calibration of S301 to S306 in FIG. 14 can be shortened. Note that, here, the process monitor unit PM measures a frequency difference amount of the oscillation circuit to a varied amount (that is, variable bias amount) of the bias current (in practice, the bias setting signal ISET) via the counter circuit CNT in FIG. 2. As described in the first embodiment, the measurement of the oscillation frequency by the counter circuit CNT and the searching processing of the coarse adjustment capacitance setting signal (first frequency setting signal) CTRM by the automatic band selector unit ABS are substantially equivalent; thus, when the frequency difference amount is identified, the setting value of the coarse adjustment capacitance setting signal CTRM is also identified based on the frequency difference amount.

Third Embodiment

In a third embodiment, details of the high-frequency signal processing device using the method 2 described above will be described. The high-frequency signal processing device of the third embodiment suppresses the abrupt fluctuation along with the switching of the bias current by controlling the power supply voltage of the oscillation circuit and/or the buffer circuit.

FIG. 15 is a block diagram illustrating a detailed configuration example of a transmission PLL block in the high-frequency signal processing device according to the third embodiment of the present invention. The transmission PLL block PLLBKtx2 has, as compared to the transmission PLL block PLLBKtx1 illustrated in FIG. 2, a configuration in which a buffer circuit BF and power supply circuits (for example, so-called serried regulators) LDO1 and LDO2 are added. In the buffer circuit BF, an oscillation output signal (first oscillation output signal) of the oscillation circuit DCO is inputted and buffered, and then an oscillation output signal (second oscillation output signal) CKout is outputted. The power supply circuit LDO1 supplies a power supply voltage VDD1 to the oscillation circuit DCO and the power supply circuit LDO2 supplies a power supply voltage VDD2 to the buffer circuit BF. The magnitudes of the power supply voltages VDD1 and VDD2 are controlled based on the power supply setting signal VSET outputted by the control circuit CTL. Note that the other part of the configuration is the same as that in FIG. 2 and thus detailed descriptions thereof are omitted.

Here, for example, a case in which the variable range of the bias setting signal ISET is the region (AR2) in FIG. 11 described above is assumed. It has been found out that, as illustrated in FIG. 11, along with an increase of the bias setting signal ISET, the lowering phenomenon of the oscillation frequency in the region (AR2) over the saturation point of the output amplitude is caused by an increase of harmonic components due to power supply clipping. Thus, when variably controlling the bias setting signal ISET in the region over the saturation point, by increasing the power supply voltage VDD1 of the oscillation circuit DCO and/or the power supply voltage VDD2 of the buffer circuit BF along with the increase of the bias setting signal ISET, occurrence of the harmonic components can be suppressed. As a result, as illustrated in FIGS. 16A and 16B, characteristics of oscillation frequency to the changes of the bias setting signal ISET can be flattened.

FIGS. 16A and 16B are schematic diagram illustrating an example of an operation principle of the high-frequency signal processing device according to the third embodiment of the present invention. In FIG. 16A, an example of oscillation frequency characteristics to the bias setting signal ISET is illustrated. The characteristics exhibit an angle characteristics curve as described in the foregoing. When the power supply voltage VDD1 and/or the power supply voltage VDD2 are increased using the power supply setting signal VSET, the output amplitude is difficult to saturate and thus the turning point transitions to the side where the bias setting value of the bias setting signal ISET increases. Thus, when the power supply voltage VDD1 and/or the power supply voltage VDD2 is increased along with an increase of the bias setting value of the bias setting signal ISET, an operating point to the bias setting signal ISET can be maintained at a substantially the same position on the angle characteristics curve.

For example, in the example of FIG. 16A, the bias setting signal ISET is sequentially increased from an origin at the bias setting value (B1) and when a lowered amount of the oscillation frequency exceeds a predetermined range, the power supply setting signal VSET is controlled by a predetermined variable voltage amount, thereby cancelling out the lowered amount of the oscillation frequency. As a result, as illustrated in FIG. 16B, ideally, the oscillation frequency characteristics to the bias setting signal ISET can be flattened (that is, sensitivity of the oscillation frequency to the bias setting signal ISET can be zero). In the third embodiment, the predetermined variable voltage amount is searched for by a calibration.

Figure 17:
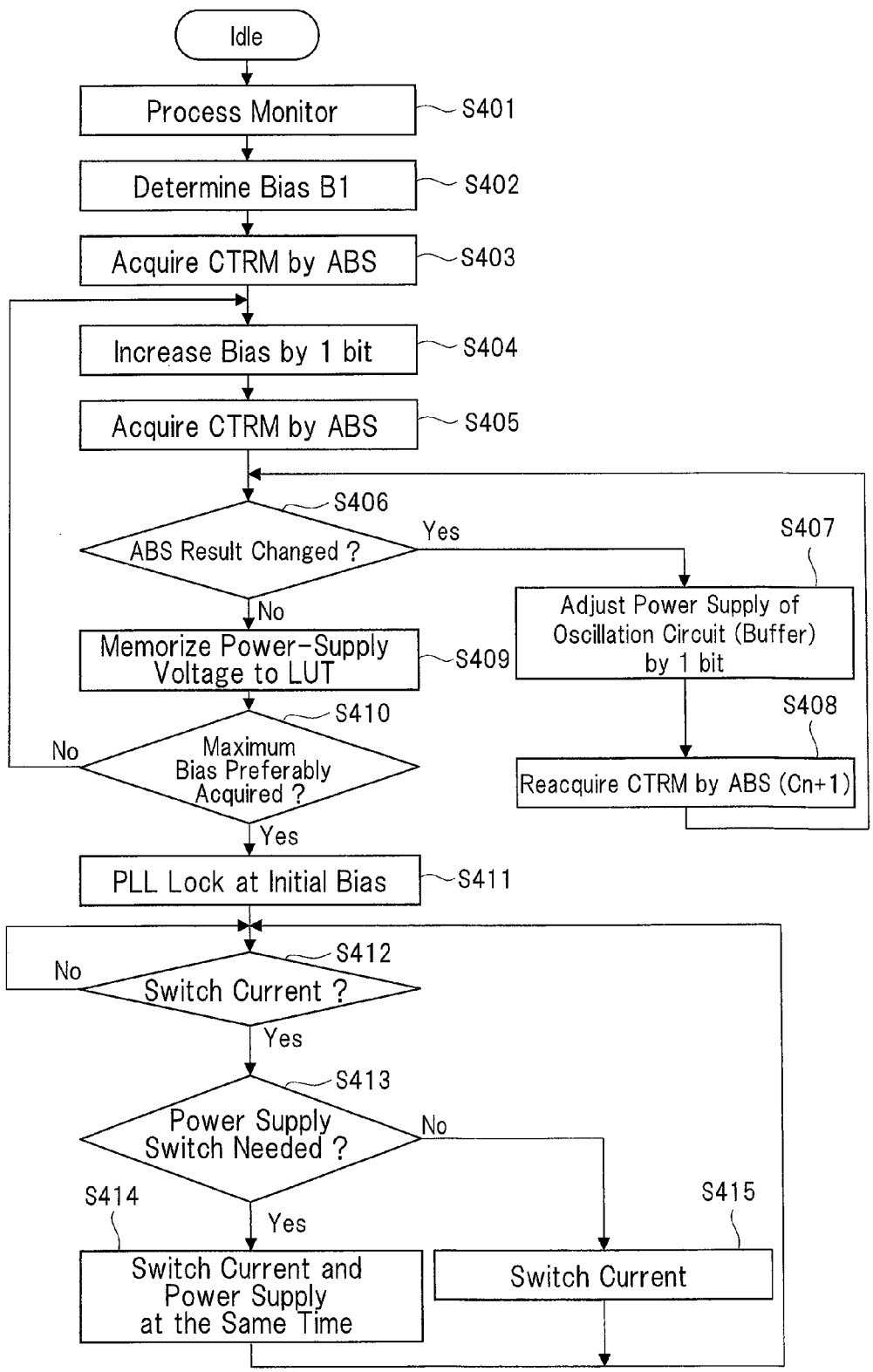
FIG. 17 is a flow chart illustrating an example of an example of detailed processing contents of a control circuit in FIG. 15 in the high-frequency signal processing device according to the third embodiment.

FIG. 17 is a flow chart illustrating an example of detailed processing contents of a control circuit in FIG. 15 of the high-frequency signal processing device according to the third embodiment of the present invention. As illustrated in FIG. 17, the control circuit CTL first determines variations of the manufacturing using the process monitor unit PM (S401), and defines the bias setting value (B1) of the bias setting signal ISET to around the turning point of the characteristics curve based on the variations (S402). Next, the control circuit CTL performs a processing using the automatic band selector unit ABS with the bias setting value (B1) to acquire a setting value of an optimum coarse adjustment capacitance setting signal (first frequency setting signal) CTRM (S403).

Subsequently, the control circuit CTL increases the bias setting value (digital code) of the bias setting signal ISET by one bit and performs a processing using the automatic band selector unit ABS to acquire a setting value of the optimum coarse adjustment capacitance setting signal CTRM (S404, S405). Here, when the setting values of those obtained in S403 and S405 are changed, the control circuit CTL repeats the processing of increasing the voltage setting value (digital code) of the power supply setting signal VSET by one bit and the processing of acquiring a setting value of the coarse adjustment capacitance setting signal CTRM using the automatic band selector unit ABS until the change of the setting values of the coarse adjustment capacitance setting signal CTRM is cancelled out (S406 to S408). When there is no change in the setting values of the coarse adjustment capacitance setting signal CTRM (or change is cancelled out), the control circuit CTL stores a voltage setting value of the power supply setting signal VSET thereupon to the memory device LUT (S409). Next, the control circuit CTL determines whether the bias setting value of the bias setting signal ISET reaches the maximum value or not (S410) and when it hasn't reached the maximum value, the processing of S404 to S409 is further repeated.

As a result, the voltage setting value of the power supply setting signal VSET for flattening the oscillation frequency characteristics to the bias setting signal ISET is retained as an optimum power supply voltage prediction table in the memory device LUT. Next, the control circuit CTL locks the PLL with the initial bias setting value of the bias setting signal ISET and the state becomes the normal operation state (S411). Thereafter, the control circuit CTL defines the setting value of the power supply setting signal VSET corresponding to the bias setting signal ISET based on the optimum power supply voltage prediction table in the memory circuit LUT each time a switching of the bias setting signal ISET is needed (S412, S413). Then, when switching of the power supply setting signal VSET is needed, the control circuit CTL switches together with the bias setting signal ISET, and, when switching is not needed, the control circuit CTL switches the bias setting signal ISET (S414, S415).

Note that, here, as illustrated in FIGS. 5A and 5B, measurement is performed by the counter circuit CNT via the automatic band selector unit ABS and the oscillation frequency is measured by acquiring the setting value of the coarse adjustment capacitance setting signal CTRM. However, in the same manner as the first embodiment etc., the measurement of oscillation frequency can be directly performed by the counter circuit CNT without using the automatic band selector unit ABS. For example, in S406 in FIG. 17, when the automatic band selector unit ABS is used, although matching/mismatching of oscillation frequencies is determined by resolution of the coarse adjustment capacitance setting signal CTRM, when the measurement is directly performed by the counter circuit CNT, matching/mismatching can be determined in a state with a higher measurement resolution; thus, a more optimum voltage setting value of the power supply setting signal VSET can be searched for.

In this case, the determination of matching/mismatching can be made such that, when a difference of the oscillation frequencies (frequency difference amount) is within a predetermined range (within a range close to zero), it is determined to be matched. In addition, as another method, instead of determining matching/mismatching, for example, measurement of oscillation frequency may be performed with actually changing the power supply setting signal VSET by one bit to search for a voltage setting value of the power supply setting signal VSET at which the frequency difference amount is minimal. Note that, the processing of the process monitor unit PM in S401 in FIG. 17 is only necessary to determine variations of the manufacturing process and it is not necessarily limited to the processing of FIGS. 8A and 8B.

Figure 18:
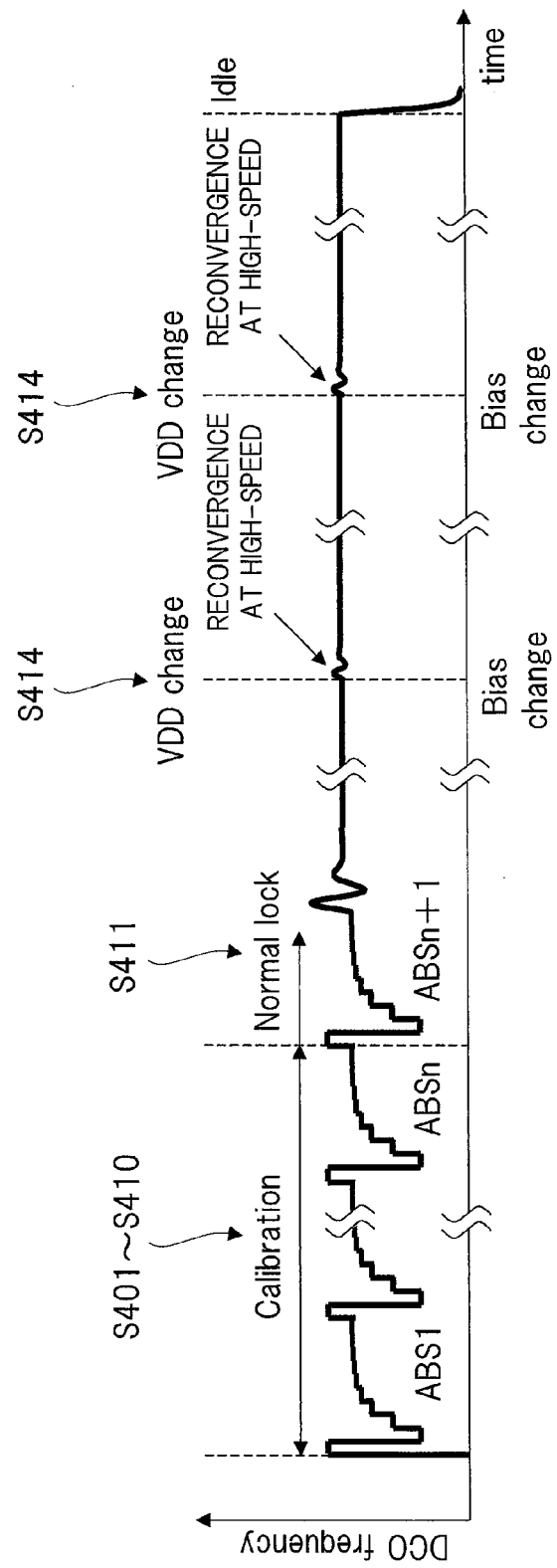
FIG. 18 is a schematic diagram illustrating a time-series operation example of the transmission PLL block to which the processing in FIG. 17 is used.

FIG. 18 is a schematic diagram illustrating a time-series operation example of the transmission PLL block to which the processing in FIG. 17 is used. As illustrated in FIG. 18, upon activating the transmission PLL block PLLBKtx2, first, along with the processing in S401 to S410 in FIG. 17, the processing by the automatic band selector unit ABS is performed for several times (ABS1 to ABSn). Next, by a processing in S411 in FIG. 17, a processing of the automatic band selector unit ABS along with normal locking of the transmission PLL block PLLBKtx2 is performed. Thereafter, by a processing in S414 in FIG. 17, switching of the power supply setting signal VSET (the power supply voltage VDD1 and/or the power supply voltage VDD2) is performed each time switching of the bias setting signal ISET is made.

In the manner as described in the foregoing, by using the high-frequency signal processing device of the third embodiment, for example, the following effects are obtained. First, upon switching the bias setting signal ISET illustrated in S414 in FIG. 18, switching of the power supply setting signal VSET is performed together. Thus, as illustrated in FIGS. 16A and 16B, abrupt fluctuations of the oscillation frequency along with switching of the bias setting signal ISET are suppressed and thus shortening of the settling time can be achieved. At this timing, which of the power supply voltages VDD1 and VDD2 to switch is selected depending on which causing saturation of the output amplitude, VDD1 or VDD2 (or both).

In addition, by using the switching of the power supply setting signal VSET, as compared to using switching of the coarse adjustment capacitance setting signal (first frequency setting signal) CTRM described in the first embodiment, abrupt fluctuations in oscillation frequency along with switching of the bias setting signal ISET may be further suppressed. For example, when the coarse adjustment capacitance setting signal CTRM is used, depending on the resolution of the coarse adjustment capacitance setting signal CTRM, even when switching of the coarse adjustment capacitance setting signal CTRM is performed, the fine capacitance setting signal (second frequency setting signal) CFINE may possibly varies to some extent before and after the switching of the bias setting signal ISET. However, by increasing the resolution of the power supply setting signal VSET, the varied amount of the fine capacitance setting signal CFINE may be further reduced.

Fourth Embodiment

In a fourth embodiment, a modification example of the processing contents of the control circuit of the third embodiment described above will be described. In the processing contents in FIG. 17 described above, since the voltage setting value of the power supply setting signal VSET is searched for with respect to each bias setting value of the bias setting signal ISET, the time required for calibration illustrated in S401 to S410 in FIG. 18 may be increased. Accordingly, in the fourth embodiment, in the same manner as the first embodiment, by using an interpolant to the power supply setting signal VSET, the time required for calibration is shortened.

Figure 20:
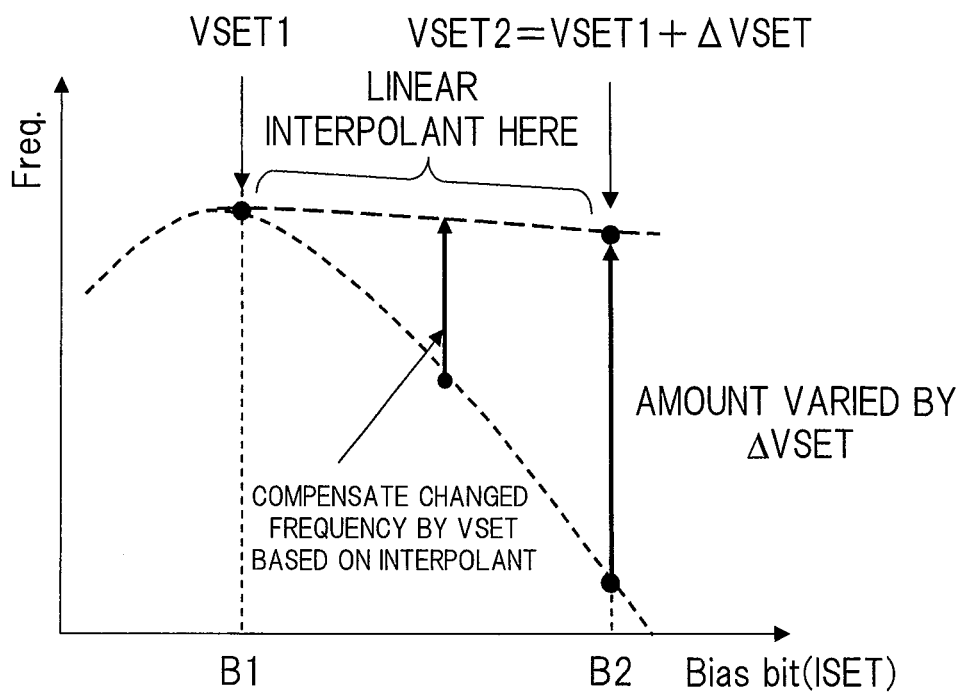
FIG. 20 is a supplemental diagram explaining processing contents in FIG. 19.

FIG. 19 is a flow chart illustrating an example of detailed processing contents of the control circuit in FIG. 15 of the high-frequency signal processing device according to the fourth embodiment of the present invention. FIG. 20 is a supplemental diagram for explaining the processing contents in FIG. 19. As illustrated in FIG. 19, the control circuit CTL first determines variations of the manufacturing process using the process monitor unit PM, and defines optimum two bias setting values (B1, B2) of the bias setting signal ISET based on the variations (S501, S502). Next, the control circuit CTL sets one of the bias setting values (B1) to acquire an optimum value (C1) of the coarse adjustment capacitance setting signal CTRM using the automatic band selector unit ABS. Subsequently, the control circuit CTL sets the other bias setting value (B2) to acquire an optimum value (C2) using the automatic band selector unit ABS (S505, S506). Next, the control circuit CTL repeats, until the acquired optimum values (C1, C2) become C1=C2, a processing of increasing the voltage setting value (digital code) of the power supply setting signal VSET by one bit and the processing of acquiring the optimum value (C2) of the coarse adjustment capacitance setting signal CTRM using the automatic band selector unit ABS again (S507 to S509). In this manner, as illustrated in FIG. 20, a voltage setting value (VSET1) in the case of the bias setting value (B1) and a voltage setting value (VSET2) in the case of the bias setting value (B2) are obtained and also a variable voltage amount ΔVSET to be a difference value between the voltage setting values is obtained. Subsequently, the control circuit CTL sustains a relationship of the variable bias amount (B2−B1) and the variable voltage amount ΔVSET as an interpolant (approximation formula of linear function) to the memory circuit LUT in FIG. 15 (S510). Although the interpolant is not specifically limited, the interpolant can be defined as Equation 2.

$$VSET=INT\{|\Delta VSET/(B2-B1)|\cdot(ISET-B1)+VSET1|\} \quad \text{Equation 2.}$$

Thereafter, the control circuit CTL locks the PLL with the initial bias setting value of the bias setting signal ISET and the state becomes a normal operation state (S511). Thereafter, the control circuit CTL defines, each time switching of the bias setting signal ISET is needed, the setting value of the power supply setting signal VSET corresponding to the bias setting signal ISET based on the interpolant inside the memory circuit LUT (S512, S513). Then, when switching of the power supply setting signal VSET is needed, the control circuit CTL switches together with the bias setting signal ISET, and when switching of the power supply setting signal VSET is not needed, the control circuit CTL switches the bias setting signal ISET (S514, S515).

In the manner described in the foregoing, by using the high-frequency signal processing device of the fourth embodiment, in addition to the various effects descried in the third embodiment, shortening of the time for calibration (in other words, activating time of the PLL) can be further achieved. As a result, it is easy to increase the number of choices of the bias setting signals ISET and power consumption of the high-frequency signal processing device can be further reduced. Note that, although measurement of oscillation frequency is performed via the automatic band selector unit ABS here, the measurement may be directly performed using the counter circuit CNT in the same manner as the third embodiment. In addition, in the memory circuit LUT, in the same manner as the first embodiment, a discrete value based on the interpolant may be stored instead of the interpolant.

Fifth Embodiment

A high-frequency signal processing device of a fifth embodiment relates to compensation of calibration accuracy and accuracy improvement with respect to the first and second embodiments described above, and its configuration follows respective embodiments. However, in the fifth embodiment, a function of monitoring a setting value of the fine adjustment variable capacitor (second variable capacitance) Cfv in FIG. 3 is needed. For example, in a case of using the oscillation circuit DCO of digital type as illustrated in FIG. 3, since the fine capacitance setting signal CFINE is given by a digital code, the setting value of the fine adjustment variable capacitor Cfv can be monitored only by reading the digital code. In addition, even when an oscillation circuit of an analog type is used, the setting value of the fine adjustment variable capacitor Cfv can be monitored by determining a control voltage of a variable capacitor (so-called varactor) by a comparator etc.

By switching the coarse adjustment capacitance to an optimum value upon switching the bias current using either of the first or second embodiment, ideally, a state in which a varied width of the fine capacitance setting signal CFINE is minimum can be constructed before and after the switching of the bias current. However, although the varied width is minimum, it has a value to some extent corresponding to switching conditions etc. of the bias current. For example, when it is possible to manage without switching the coarse adjustment capacitance before and after switching the bias current, a varied width of the fine capacitance setting signal CFINE is generated only by an amount corresponding to a frequency fluctuation between before and after switching the bias current. In addition, even when the coarse adjustment capacitance is switched before and after switching the bias current, in practice, a varied width to some extent is generated in the fine capacitance setting signal CFINE.

In addition, as described above, although a state in which the varied width of the fine capacitance setting signal CFINE is minimum can be constructed ideally, since a linear interpolation is performed in the first and embodiments, in practice, error from an ideal state occurs. Further, the varied width of the fine capacitance setting signal CFINE may be changed in time series corresponding to a temperature change generated in actual operation even if the bias current is switched in the same manner. Normally, the PLL adjust and reconverges the error or change by a fine adjustment capacitance.

Here, in the PLL, when a frequency jumps, the loop starts reconvergence; thus, the fine capacitance setting signal CFINE is greatly changed. The larger a changed amount ($\Delta$CFINE) of the fine capacitance setting signal CFINE here, the higher the possibility of unlocking. Even when unlocking does not happen, time until finishing the reconvergence (that is, settling time) is elongated. Such a problem may occur in a case in which $\Delta$CFINE increases along with error from an ideal state along with the linear interpolation or a case in which $\Delta$CFINE tends to increase in time series corresponding to a temperature change etc.

Figure 21:
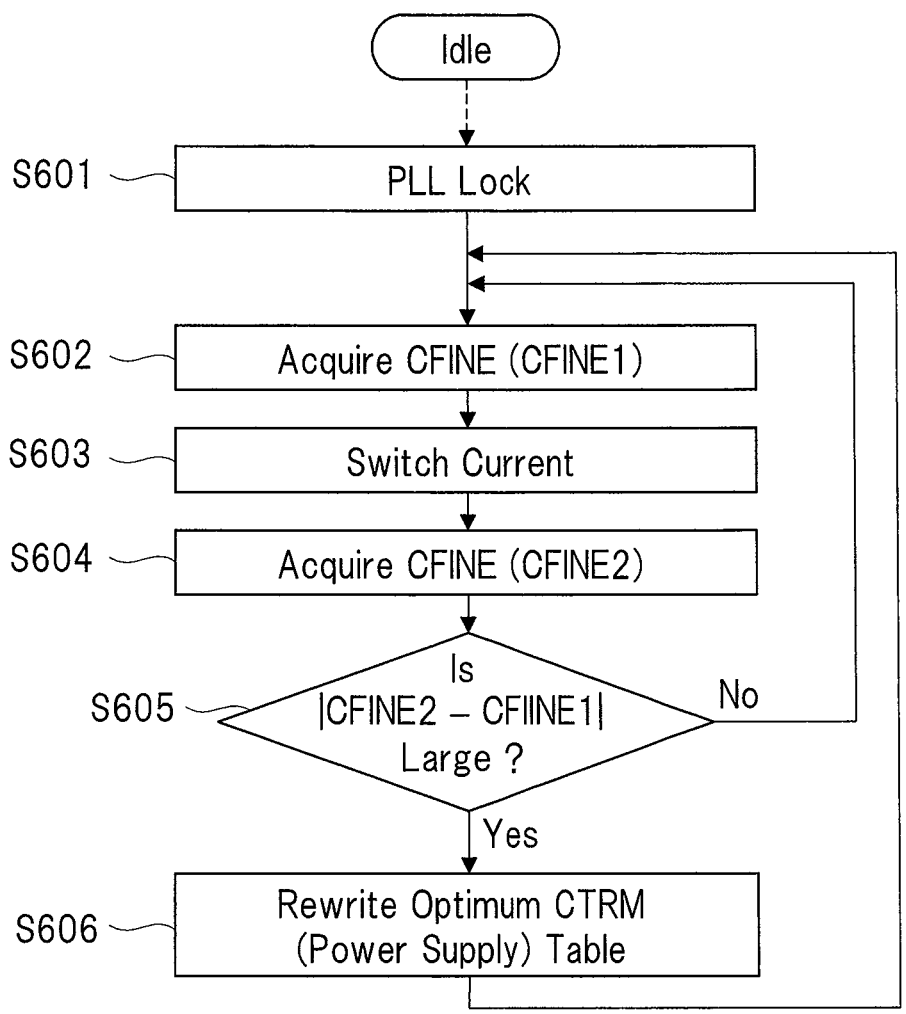
FIG. 21 is a flow chart illustrating an example of processing contents of a high-frequency signal processing device according to a fifth embodiment of the present invention.

Accordingly, in the fifth embodiment, in the state of normal operation after the calibration in the first and second embodiment, a processing as illustrated in FIG. 21 is carried out. FIG. 21 is a flow chart illustrating an example of processing contents of the high-frequency signal processing device according to the fifth embodiment of the present invention. The processing contents are carried out by, for example, the control circuit CTL in FIG. 2. As illustrated in FIG. 21, when switching of the bias current (bias setting signal ISET) occurring in the normal operation is performed (S601), the control circuit CTL memories a setting value of the fine capacitance setting signals CFINE before and after the switching) and confirms a difference therebetween $\Delta$CFINE (|CFINE2−CFINE|) (S602 to S605).

Next, while there is no problem when $\Delta$CFINE is sufficiently small, when $\Delta$CFINE is larger than a predicted value and determined to be optimizable by the coarse capacitance, the control circuit CTL rewrites the optimum coarse adjustment capacitance prediction table in the memory circuit LUT described in the first embodiment (S606). More specifically, it is determined in which way of increasing or decreasing the coarse adjustment capacitance is shifted by one bit depending on whether $\Delta$CFINE is positive or negative, and a value after shifting the coarse adjustment capacitance is programmed in the optimum coarse adjustment capacitance table.

Figure 22A:
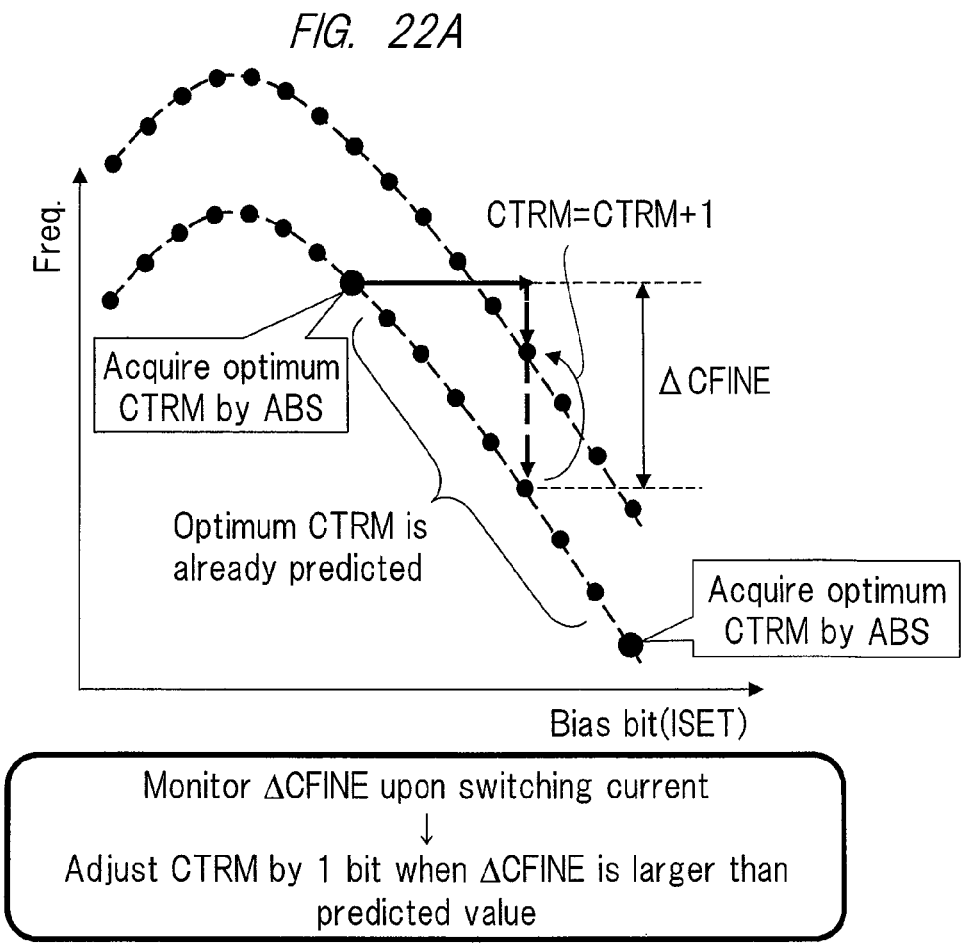
FIG. 22A is a supplemental diagram explaining the processing contents of FIG. 21.
Figure 22B:
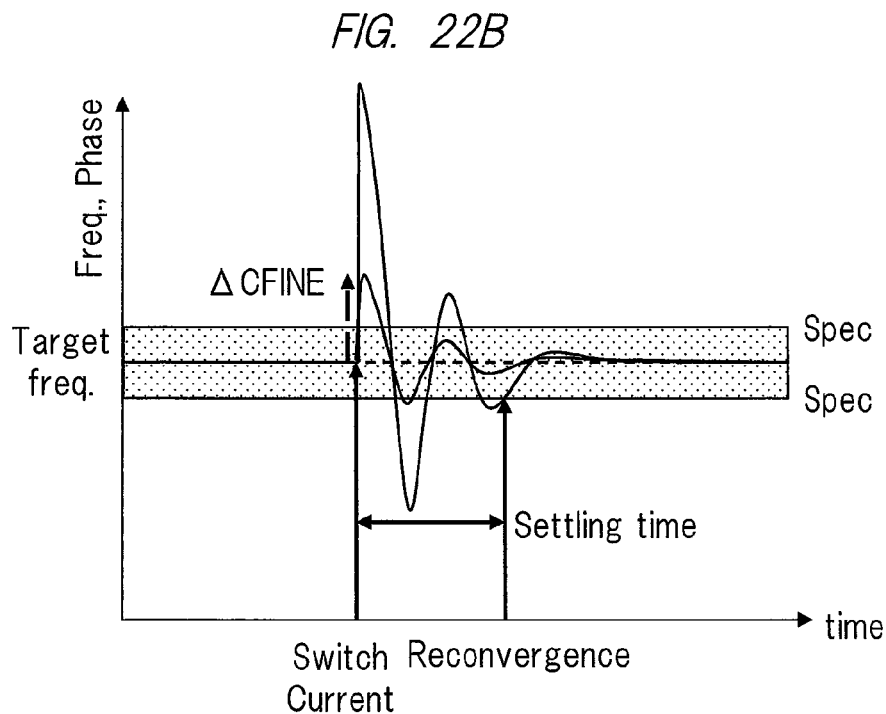
FIG. 22B is a supplemental diagram explaining the processing contents of FIG. 21.

FIGS. 22A and 22B are supplemental diagrams for explaining processing contents of FIG. 21. In the example in FIG. 22A, since a varied amount of $\Delta$CFINE is larger than a predicted value before and after switching of the bias setting signal ISET, the coarse adjustment capacitance setting signal CTRM is increased by one bit. That is, the setting value of the coarse adjustment capacitance setting signal CTRM corresponding to the bias setting signal ISET after switching is written on the memory circuit LUT. In this manner, as illustrated in FIG. 22B, an abrupt fluctuation of the oscillation frequency along with switching of the bias setting signal ISET is suppressed.

Note that, while a method of rewriting the optimum coarse adjustment capacitance prediction table has been used here, to improve safety, the switching pattern may be temporally disabled when a larger change of the $\Delta$CFINE than a predicted value is detected to temporally disable reduction of the bias current. In this case, at a suitable timing thereafter, a calibration is performed again using that of the first or second embodiment.

Sixth Embodiment

In a sixth embodiment, details of the high-frequency signal processing device using the method 3 will be described. The high-frequency signal processing device of the sixth embodiment includes the transmission PLL block PLLBKtx2 illustrated in FIG. 15 and further the temperature sensor TMP as illustrated in FIG. 1. For example, when the high-frequency signal processing devices of the first to fifth embodiments described above are used, upon activating the PLL, a calibration including a process monitor is carried out; however, after the calibration, accuracy of the calibration may be lowered when a temperature change occurs. As a countermeasure of this, for example, carrying out the calibration including the process monitor again each time temperature changes to some extent is considered; however, in this case, extra time or extra power consumption is needed along with the calibration.

Figure 23:
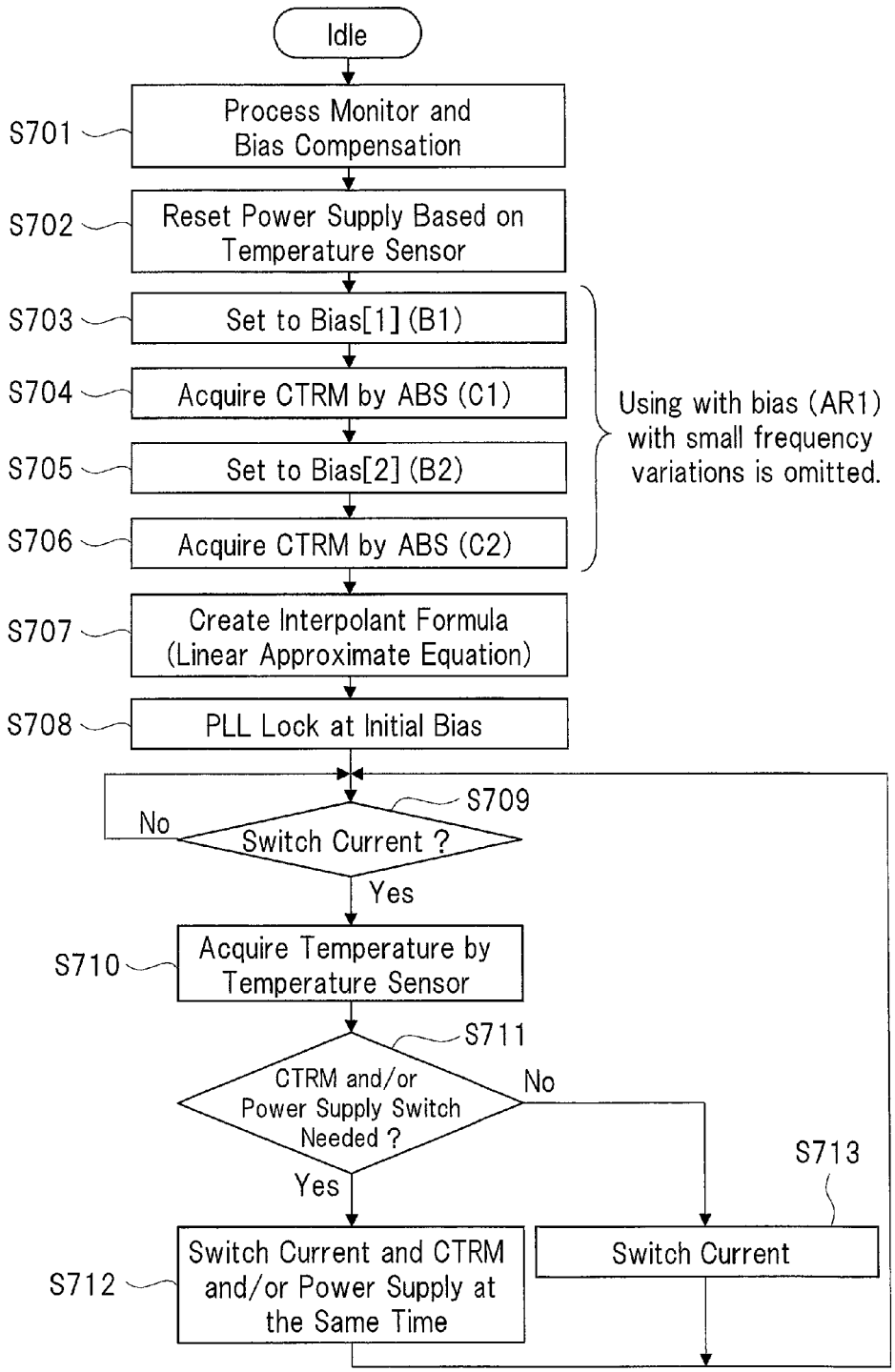
FIG. 23 is a flow chart illustrating an example of detailed processing contents of the control circuit in FIG. 15 in a high-frequency signal processing device according to a sixth embodiment of the present invention.
Figure 24:
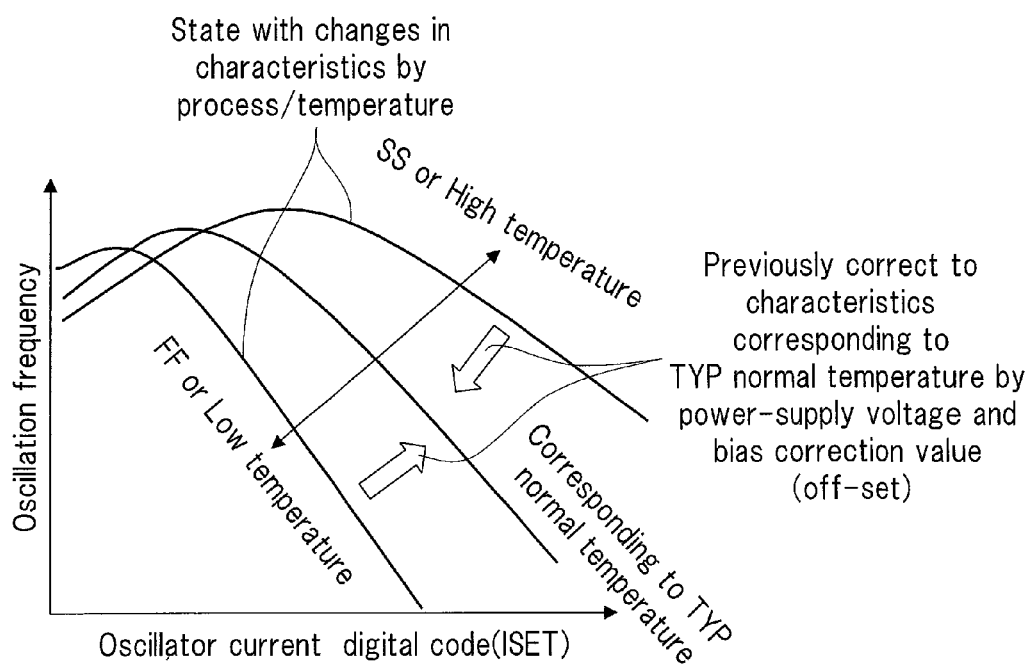
FIG. 24 is a supplemental diagram explaining the processing contents of FIG. 23.

Accordingly, in the sixth embodiment, by carrying out the calibration once upon activating the PLL so that accuracy of the calibration can be ensured without carrying out the calibration again even when a temperature change occurs thereafter. FIG. 23 is a flow chart illustrating an example of detailed processing contents of the control circuit in FIG. 15 of the high-frequency signal processing device according to the sixth embodiment of the present invention. FIG. 24 is a supplemental diagram for explaining the processing contents in FIG. 23.

As illustrated in FIG. 23, the control circuit CTL first determines variations of the manufacturing process by a process monitor an adds in a fixed way a predetermined off-set amount to the bias setting signal ISET so that the oscillation frequency characteristics to the bias current (bias setting signal ISET) has the TYP characteristics as illustrated in FIG. 24 (S701). Further the control circuit CTL acquires temperature upon activating the PLL by the temperature sensor TMP, refers to a temperature compensation table previously mounted inside the memory circuit LUT in the design stage, defines a voltage setting value of the power supply setting signal VSET so that the oscillation frequency characteristics to the bias current (bias setting signal ISET) are characteristics at a room temperature, and controls the power supply voltages VDD1 and/or VDD2 based on the voltage setting value (S702).

More specifically, in the sixth embodiment, the variable control of the power supply setting signal VSET is not used to flatten the oscillation frequency characteristics like the third and fourth embodiments but used to compensate temperature. By the processing of S701 and S702 in FIG. 23, as illustrated in FIG. 24, the oscillation frequency characteristics to the bias current (bias setting signal ISET) are corrected so that the oscillation frequency characteristics are the TYP characteristics or room-temperature characteristics. For example, when the temperature is increased, the angle characteristics curve becomes similar to the SS characteristics because the bias current becomes more difficult to flow, and on the other hand, when the temperature is lowered, the angle characteristics curve becomes similar to the FF characteristics because the bias current becomes easier to flow. Since the angle characteristics curve can be controlled by the power supply setting signal VSET as illustrated in FIG. 16A, the temperature change can be compensated by the power supply setting signal VSET. Note that, while the oscillation frequency characteristics are corrected to be the room-temperature characteristics here, it is needless to say that characteristics are not limited to that and are corrected to be optional temperature characteristics.

Next, as illustrated in FIG. 23, the control circuit CTL carries out the calibration (that is, creating and storing the interpolant and the optimum coarse adjustment capacitance table) and PLL locking at the initial bias setting value in the same manse as the processing of S303 to S308 in FIG. 12 (S703 to S708). There after, the control circuit CTL acquires the temperature again using the temperature sensor TMP each time switching of the bias setting signal ISET is performed (S709, S710).

Subsequently, the control circuit CTL defines an optimum setting value of the coarse adjustment capacitance setting signal CTRM based on a result of the calibration (that is, the interpolant and the optimum coarse adjustment capacitance table) in the same manner as that in FIG. 12, and in addition, an optimum voltage setting value of the power supply setting signal VSET based on the temperature compensation table (S711). Then, when switching of the coarse adjustment capacitance setting signal CTRM and/or the power supply setting signal VSET is needed, the control circuit CTL switches along with switching of the bias setting signal ISET; and when switching of the coarse adjustment capacitance setting signal CTRM and/or the power supply setting signal VSET is not needed, the control circuit CTL switches the bias setting signal ISET (S712, S713).

As described in the foregoing, by using the high-frequency signal processing device of the sixth embodiment, for example, the following effects can be obtained. First, the calibration (that is, creating and storing the interpolant and the optimum coarse adjustment capacitance table) in S703 to S707 is carried out in a state in which the variations of the manufacturing process and temperature are compensated by S701 and S702. In this manner, accuracy of the calibration can be improved. In addition, as illustrated in S709 to S713, also upon switching the bias setting signal ISET in a state of normal operation, definition and switching of the coarse adjustment capacitance setting signal CTRM based on the calibration result are always carried out in a state the oscillation frequency characteristics are corrected to the TYP characteristics or room-temperature characteristics.

In this manner, upon carrying out the calibration and upon reflecting a result of the calibration, a highly accurate calibration result is always maintained. Thus, the abrupt fluctuations in oscillation frequency along with switching of the bias setting signal ISET can be further suppressed and shortening of the settling time can be achieved. Note that, upon carrying out the calibration in S703 to S707, since the variations of the manufacturing process and the temperature are previously compensated, the bias setting value (B1) and the bias setting value (B2) can be fixed values previously defined in the design stage.

Further, time required for the calibration can be shortened. That is, as illustrated in FIG. 23, once the calibration is carried out, even when a temperature change occurs there after, the temperature change can be compensated by the power supply setting signal VSET without carrying out the calibration again. Here, carrying out time of the one-time calibration is also shortened by using the interpolant in the same manner as the first embodiment or else. However, even in the case of using the method not using an interpolant like Patent Document 1, the effect of the capability of reducing the calibration along with a temperature change can be obtained.

In addition, the calibration can be easier including the temperature compensation. More specifically, since the calibration can be carried out after the variations of the manufacturing process and temperature change are compensated by other variables, the tables made along with the calibration can be simplified and thus the calibration can be easier as a result. The tables retained in the memory circuit LUT are the process table previously mounted in the design stage, the temperature compensation table previously mounted at the design stage, and the optimum coarse adjustment capacitance table created upon calibration (or interpolant). In the process table, for example, premising the process monitor unit PM in FIG. 8, a determination result of the variations of the manufacturing process an off-set amount of the bias setting signal ISET per the determination result corresponding to a frequency difference to be a measurement result and so forth are defined. In the temperature compensation table, a voltage setting value of the power supply setting signal VSET to temperature and so forth are defined.

Here, as a comparative example, instead of the process table and the temperature compensation table, for example, a table defining a relationship of the variations of the manufacturing process, temperature, and the off-set amount of the bias setting signal ISET for compensating the variations and temperature may be mounted in the design stage. However, the contents of table may be complicated, and also a sufficient accuracy may not be ensured by a compensation of only the off-set amount of the bias setting signal ISET. In the method of the sixth embodiment, by dividing the table into two, the contents of the table can be simplified, and, by carrying out the compensation using two variables of the off-set amount of the bias setting signal ISET and the power supply setting signal VSET, the accuracy of the compensation can be improved.

Seventh Embodiment

In a seventh embodiment, details of a high-frequency signal processing device using the method 4 described above will be described. The high-frequency signal processing device of the seventh embodiment includes the transmission PLL block PLLBKtx2 illustrated in FIG. 15 in which a control circuit carries out a processing like a combination of the processing in FIG. 12 described in the first embodiment and the processing in FIG. 19 described in the fourth embodiment. In the first embodiment, since the setting value of the coarse adjustment capacitance setting signal CTRM is defined by an interpolant (approximation formula of linear function), slight error may occur. Accordingly, in the seventh embodiment, after previously improving linearity of the characteristics curve using the processing in the same manner as the fourth embodiment, the same processing as the first embodiment is carried out.

Figure 25:
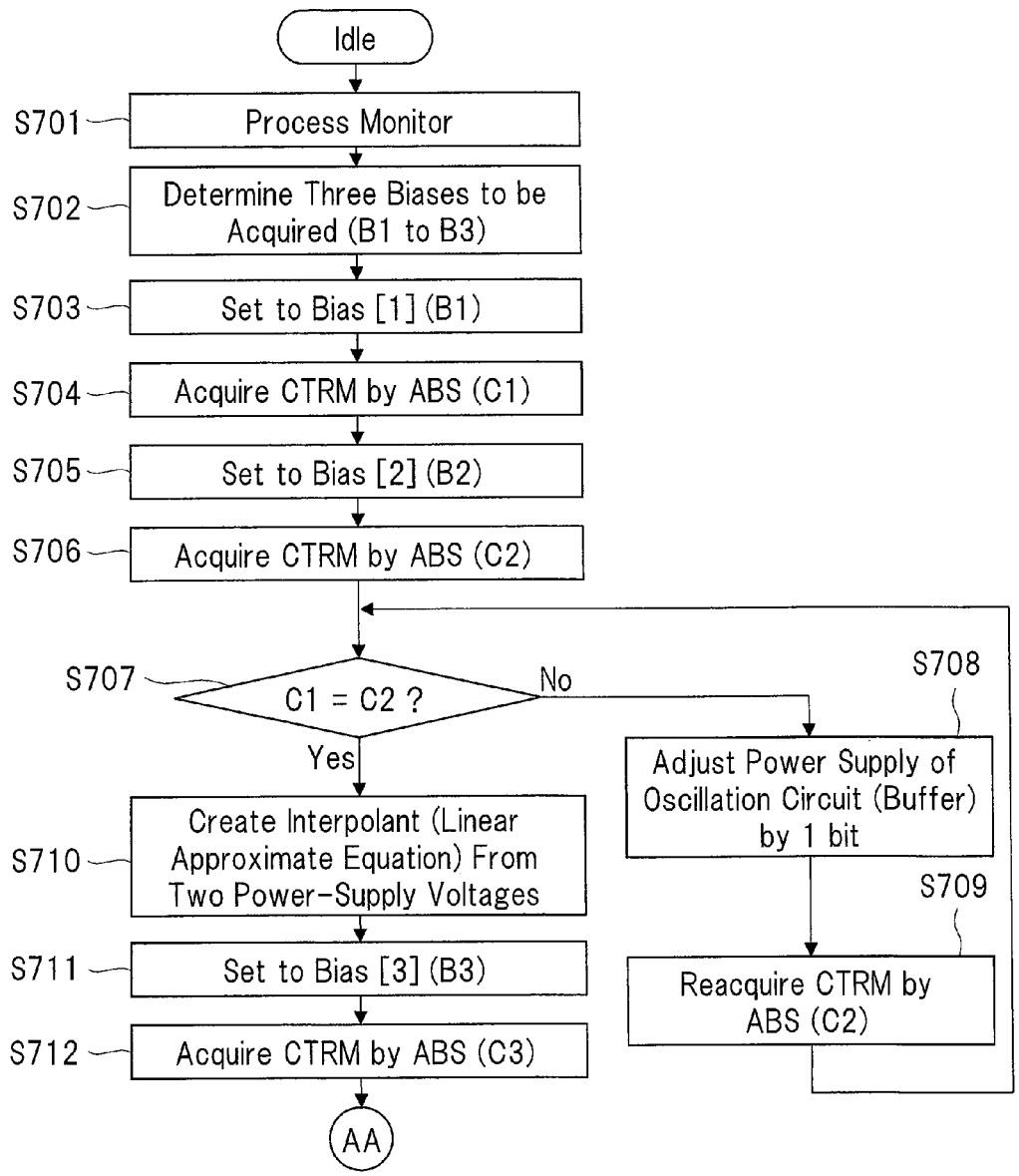
FIG. 25 is a flow chart illustrating an example of detailed processing contents of the control circuit in FIG. 15 in a high-frequency signal processing device according to a seventh embodiment of the present invention.
Figure 26:
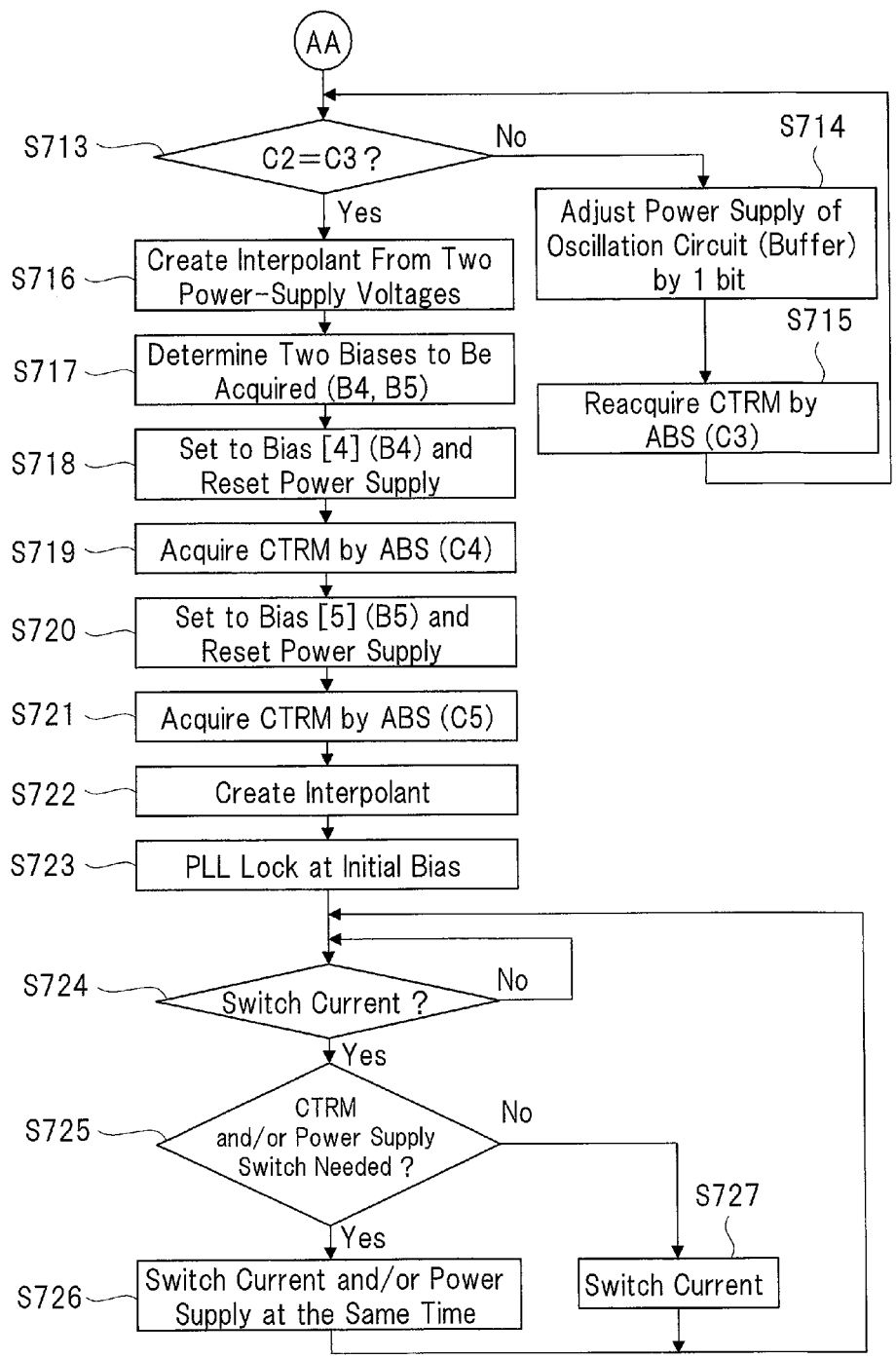
FIG. 26 is a flow chart illustrating an example of processing contents continued from FIG. 25.
Figure 27A:
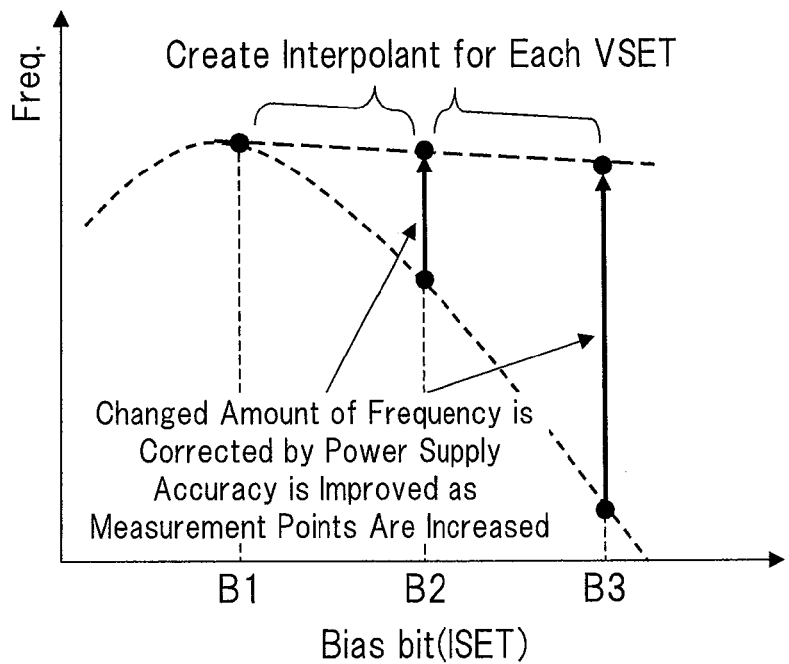
FIG. 27A is a supplemental diagram explaining processing contents in FIGS. 25 and 26.
Figure 27B:
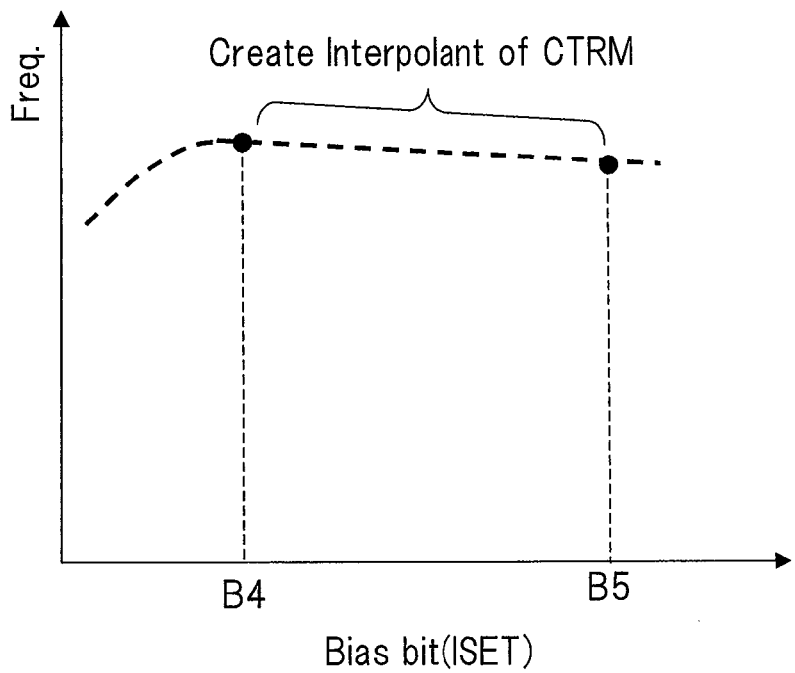
FIG. 27B is a supplemental diagram explaining processing contents in FIGS. 25 and 26.

FIG. 25 is a flow chart illustrating an example of detailed processing contents of the control circuit in FIG. 15 in the high-frequency signal processing device of the seventh embodiment of the present invention. FIG. 26 is a flow chart illustrating an example of processing contents continued from FIG. 25. FIGS. 27A and 27B are supplemental diagrams for explaining the processing contents of FIGS. 25 and 26. In FIGS. 25 and 26, the control circuit CTL first carries out process monitoring (S701) and defines three bias setting values of the bias setting signal ISET (B1 to B3) based on a result of the process monitoring (S702).

Next, the control circuit CTL creates an interpolant (approximation formula of linear function) of the power supply setting signal VSET by the same processing as that of S503 to S510 in FIG. 19 between the bias setting value B1 and the bias setting value B2 (S703 to S710). Further, the control circuit CTL creates an interpolant (approximation formula of linear function) by the same processing as that of S503 to S510 in FIG. 19 also between the bias setting value B1 and the bias setting value B3 (S711 to S716). Here, the processing of the automatic band selector unit ABS on the bias setting value B2 can be omitted since the processing has been already carried out in the stage of S703 to S710.

Here, as illustrated in FIG. 27A, although a characteristics curve of the oscillation frequency characteristics to the bias current (bias setting signal ISET) is a curve in practice, in the first embodiment, the curve is considered to a linear line and a linear interpolation is carried out between two points. Accordingly, in the processing of S703 to S716 in FIG. 25 described above, the linearity of the characteristics curve is previously improved by creating interpolants between the bias setting values B1 and B2 and between the bias setting values B2 and B3, respectively. Note that, since the more the bias setting values are, the more time required for calibration is, it is preferable that the bias setting values are defined as many as possible additionally considering the relationship with time and the linear interpolation is carried out between bias setting values next to each other.

In FIGS. 25 and 26, the control circuit CTL defines two bias setting values (B4, B5) of the bias setting signal ISET based on the result of the process monitoring after finishing the processing of S716. Then, the control circuit CTL creates, as illustrated in FIG. 27B, an interpolant (approximation formula of linear function) of the coarse adjustment capacitance setting signal CTRM by the same processing as that of S303 to S307 in FIG. 12 (S718 to S722). Note that the processing is carried out in a state in which the voltage setting value of the power supply setting signal VSET is suitably set based on the interpolant (approximation formula of linear function) of the power supply setting signal VSET described above to each of the bias setting values (B4, B5).

Subsequently, the control circuit CTL carries out PLL locking with the initial bias setting value and the operation is shifted to a normal operation (S723). Thereafter, the control circuit CTL defines a voltage setting value of the power supply setting signal VSET and a setting value of the coarse adjustment capacitance setting signal CTRM based on the interpolant (approximation formula of linear function) of the power supply setting signal VSET and the interpolant (approximation formula of linear function) of the coarse adjustment capacitance setting signal CTRM each time switching of the bias setting signal ISET is performed (S724, S725). Then, when switching of the power supply setting signal VSET and/or the coarse adjustment capacitance setting signal CTRM is needed, control circuit CTL switches together with switching of the bias setting signal ISET, and when switching of the power supply setting signal VSET and/or the coarse adjustment capacitance setting signal CTRM is not needed, the control circuit CTL switches the bias setting signal ISET (S726, S727).

As described in the foregoing, by using the high-frequency signal processing device of the seventh embodiment, as compared to the first embodiment and the fourth embodiment, accuracy of the calibration can be further improved. As a result, the abrupt fluctuations in the oscillation frequency along with switching of the bias setting signal ISET can be further suppressed and shortening of the settling time can be achieved. In addition, here, the risk of unlocking which may occur due to error from an ideal state along with the linear interpolation as described in the fifth embodiment can be reduced together.

In the foregoing, the invention made by the inventors of the present invention has been concretely described based on the embodiments. However, it is needless to say that the present invention is not limited to the foregoing embodiments and various modifications and alterations can be made within the scope of the present invention. For example, the embodiments described above have been described in details for explaining the present invention to make them easy to understand and thus the embodiments are not necessarily limited to those having all the configurations described above. In addition, a part of a configuration of an embodiment can be exchanged by a configuration of another embodiment. Also, a part of a configuration of an embodiment can be added to a configuration of another embodiment. Also, regarding a part of the configuration of each embodiment, addition, cancellation, exchange of another configuration can be made.

For example, although the switching of bias current has been carried out to the transmission PLL here, in some cases, the switching of bias current can be carried out also to a reception PLL block in the same manner. In addition, although the descriptions have been made exemplifying PLL blocks included in high-frequency signal processing devices for mobile phone systems here, the target is not limited to this and thus, as long as it is a device and a system including a PLL and having a configuration capable of setting a plurality of power modes to the PLL block, the same effects can be obtained when such a PLL block is used. Moreover, for example, although a combination of the first embodiment and the fourth embodiment has been described in the seventh embodiment, it is needless to say that the combination is not limited to this and the first and second embodiments or the third and fourth embodiments can be suitably combined in the same manner.

What is claimed is:

1. A high-frequency signal processing device comprising:
   an oscillation circuit for generating an oscillation output signal having a predetermined frequency, controlling a frequency at a first resolution corresponding to a first frequency setting signal, and controlling a frequency at a second resolution that is higher than the first resolution corresponding to a second frequency setting signal, the oscillation circuit being operated with a bias current corresponding to a bias setting signal;
   a feedback loop circuit for controlling the second frequency setting signal by feedback control when a loop setting signal is at an ON level so that a phase of a signal obtained by feeding back the oscillation output signal and a phase of a reference locking signal are matched, and setting the feedback control to an opened state when the loop setting signal is at an OFF level;
   a measurement circuit for measuring a frequency of the oscillation output signal in a state in which the loop setting signal is at the OFF level; and
   a control circuit for controlling the bias setting signal and the first frequency setting signal,
   wherein the control circuit carries out:
      a first processing of measuring a frequency difference amount between a frequency of the oscillation output signal obtained upon setting the bias setting signal to a first bias setting value and a frequency of the oscillation output signal obtained upon setting the bias setting signal to a second bias setting value by making the measurement circuit measure in the state in which the loop setting signal is at the OFF level;
      a second processing of retaining a relationship of the frequency difference amount and a variable bias amount between the second bias setting value and the first bias setting value obtained in the first processing; and
      a third processing of, in the state in which the loop setting signal is at the ON level, defining a changed amount of the frequency of the oscillation output signal to a changed amount of the bias setting signal upon changing the bias setting signal, and controlling the first frequency setting signal based on the defined changed amount of the frequency.

2. The high-frequency signal processing device according to claim 1,
   wherein the control circuit further includes a process monitor unit for making the measurement circuit measure in the state in which the loop setting signal is at the OFF level, detecting sensitivity of the frequency of the oscillation output signal to a change in the bias setting signal, and determining a level of variation of a manufacturing process corresponding to a result of the detection based on a process table previously mounted in a design stage, and
   the control circuit further carries out, before carrying out the first processing, a fourth processing for determining the level of variations of the manufacturing process using the process monitor unit and defining the first and second bias setting values used in the first processing corresponding to the level of variations of the manufacturing process.

3. The high-frequency signal processing device according to claim 2,
   wherein the control circuit includes an automatic frequency selector unit for making the measurement circuit measure in the state in which the loop setting signal is at the OFF level and automatically searching for an optimum setting value of the first frequency setting signal upon setting the frequency of the oscillation output signal to a target frequency, and
   upon carrying out the first processing, the control circuit makes the measurement circuit measure via the automatic frequency selector unit and measures, as the frequency difference amount, a different amount between a setting value of the first frequency setting signal obtained upon setting the bias setting signal to the first bias setting value and a setting value of the first frequency setting signal obtained upon setting the bias setting signal to the second bias setting value.

4. The high-frequency signal processing device according to claim 3,
   wherein the oscillation circuit includes:
   an LC tank circuit including an inductor and a capacitor;
   a negative resistance generating circuit including a transistor and being coupled the LC tank circuit; and
   a variable current source coupled to the negative resistance generating circuit and generating the bias current corresponding to the bias setting signal, and
   the LC tank circuit includes:
   a first variable capacitor having a frequency controlled at the first resolution corresponding to the first frequency setting signal; and
   a second variable capacitor having a frequency controlled at the second resolution corresponding to the second frequency setting signal.

5. The high-frequency signal processing device according to claim 4, further comprising:
   a mixer circuit for up-converting a baseband signal using the oscillation output signal; and
   a power amplifier circuit for amplifying an output signal of the mixer circuit by a gain based on a power instruction signal, wherein the control circuit changes, upon changing the bias setting signal in the third processing, the bias setting signal based on the power instruction signal.

6. A high-frequency signal processing device comprising:
an oscillation circuit for generating a first oscillation output signal having a predetermined frequency, controlling a frequency at a first resolution corresponding to a first frequency setting signal, and controlling a frequency at a second resolution that is higher than the first resolution corresponding to a second frequency setting signal, the oscillation circuit being operated with a bias current corresponding to a bias setting signal;
a buffer circuit for receiving the first oscillation output signal and outputting a second oscillation output signal;
a power supply circuit for generating a power supply signal corresponding to a power supply voltage setting signal and supplying the power supply voltage to one of or both of the oscillation circuit and the buffer circuit;
a feedback loop circuit for controlling the second frequency setting signal by feedback control when a loop setting signal is at an ON level so that a phase of a signal obtained by feeding back the second oscillation output signal and a phase of a reference locking signal are matched, and setting the feedback control to an opened state when the loop setting signal is at an OFF level;
a measurement circuit for measuring a frequency of the second oscillation output signal in a state in which the loop setting signal is at the OFF level; and
a control circuit for controlling the bias setting signal and the first frequency setting signal,
wherein the control circuit carries out:
a first processing of searching for the second voltage setting value so that a frequency difference amount between a frequency of the second oscillation output signal obtained upon setting the bias setting signal to a first bias setting value and a frequency of the second oscillation output signal obtained upon setting the bias setting signal to a second bias setting value is within a predetermined range by making the measurement circuit measure in the state in which the loop setting signal is at the OFF level;
a second processing of retaining a relationship of the frequency difference amount and a variable bias amount between the second bias setting value and the first bias setting value obtained in the first processing; and
a third processing of, in the state in which the loop setting signal is at the ON level, defining a variable voltage amount to a changed amount of the bias setting signal based on the relationship retained in the second processing upon changing the bias setting signal, and controlling the power supply voltage setting signal based on the defined variable voltage amount.

7. The high-frequency signal processing device according to claim 6,
wherein, upon carrying out the second processing, the control circuit retains a relationship of the variable bias amount and the variable voltage amount by approximating to a linear function.

8. The high-frequency signal processing device according to claim 6,
wherein, upon carrying out the first processing, the control circuit searches for each of the second voltage setting value corresponding to the second bias setting values while changing the second bias setting value in a step-by-step manner, and upon carrying out the second processing, the control circuit retains the relationship of a plurality of the variable bias amounts obtained corresponding to a plurality of the second voltage setting values.

9. The high-frequency signal processing device according to claim 7,
wherein the control circuit further includes a process monitor unit for making the measurement circuit measure in the state in which the loop setting signal is at the OFF level, detecting sensitivity of the frequency of the second oscillation output signal to a change in the bias setting signal, and determining a level of variation of a manufacturing process corresponding to a result of the detection based on a process table previously mounted in a design stage, and
the control circuit further carries out, before carrying out the first processing, a fourth processing for determining the level of variations of the manufacturing process using the process monitor unit and defining the first and second bias setting values used in the first processing corresponding to the level of variations of the manufacturing process.

10. The high-frequency signal processing device according to claim 9,
wherein the control circuit includes an automatic frequency selector unit for making the measurement circuit measure in the state in which the loop setting signal is at the OFF level and automatically searching for an optimum setting value of the first frequency setting signal upon setting the frequency of the second oscillation output signal to a target frequency, and
upon carrying out the first processing, the control circuit makes the measurement circuit measure via the automatic frequency selector unit and measures, as the frequency difference amount, a different amount between a setting value of the first frequency setting signal obtained upon setting the bias setting signal to the first bias setting value and a setting value of the first frequency setting signal obtained upon setting the bias setting signal to the second bias setting value.

11. The high-frequency signal processing device according to claim 10,
wherein the oscillation circuit includes:
an LC tank circuit including an inductor and a capacitor;
a negative resistance generating circuit including a transistor and being coupled the LC tank circuit; and
a variable current source coupled to the negative resistance generating circuit and generating the bias current corresponding to the bias setting signal, and
the LC tank circuit includes:
a first variable capacitor having a frequency controlled at the first resolution corresponding to the first frequency setting signal; and
a second variable capacitor having a frequency controlled at the second resolution corresponding to the second frequency setting signal.

12. The high-frequency signal processing device according to claim 11, further comprising:
a mixer circuit for up-converting a baseband signal using the oscillation output signal; and
a power amplifier circuit for amplifying an output signal of the mixer circuit by a gain based on a power instruction signal,
wherein the control circuit changes, upon changing the bias setting signal in the third processing, the bias setting signal based on the power instruction signal.

13. A high-frequency signal processing device comprising:
an oscillation circuit for generating a first oscillation output signal having a predetermined frequency, controlling a frequency at a first resolution corresponding to a first frequency setting signal, and controlling a frequency at a second resolution that is higher than the first resolution corresponding to a second frequency setting signal, the oscillation circuit being operated with a bias current corresponding to a bias setting signal;
a buffer circuit for receiving the first oscillation output signal and outputting a second oscillation output signal;
a power supply circuit for generating a power supply signal corresponding to a power supply voltage setting signal and supplying the power supply voltage to one of or both of the oscillation circuit and the buffer circuit;
a feedback loop circuit for controlling the second frequency setting signal by feedback control when a loop setting signal is at an ON level so that a phase of a signal obtained by feeding back the second oscillation output signal and a phase of a reference locking signal are matched, and setting the feedback control to an opened state when the loop setting signal is at an OFF level;
a measurement circuit for measuring a frequency of the second oscillation output signal in a state in which the loop setting signal is at the OFF level; and
a control circuit for controlling the bias setting signal and the first frequency setting signal,
wherein the control circuit carries out:
  a first processing of measuring a frequency difference amount between a frequency of the second oscillation output signal obtained upon setting the bias setting signal to a first bias setting value and a frequency of the second oscillation output signal obtained upon setting the bias setting signal to a second bias setting value is within a predetermined range by making the measurement circuit measure in the state in which the loop setting signal is at the OFF level;
  a second processing of retaining a relationship of the frequency difference amount and a variable bias amount between the second bias setting value and the first bias setting value obtained in the first processing; and
  a third processing of, in the state in which the loop setting signal is at an ON level, defining a frequency difference amount to a changed amount of the bias setting signal based on the relationship retained in the second processing upon changing the bias setting signal, and controlling the power supply voltage setting signal based on the defined frequency difference amount.

14. The high-frequency signal processing device according to claim 13,
wherein the control circuit further includes a process monitor unit for making the measurement circuit measure in the state in which the loop setting signal is at the OFF level, detecting sensitivity of the frequency of the second oscillation output signal to a change in the bias setting signal, and determining a level of variations of a manufacturing process corresponding to a result of the detection based on a process table previously mounted in a design stage, and
the control circuit further carries out, before carrying out the first processing, a fourth processing of defining an off-set amount corresponding to the level of variations of the manufacturing process based on the process table and adding the defined off-set amount to the bias setting signal so that the variations of the manufacturing process compensates variations of the manufacturing process.

15. The high-frequency signal processing device according to claim 14,
further comprising a temperature sensor,
wherein the control circuit carries out a fifth processing of, before carrying out the first processing, defining a voltage setting value of the power supply voltage setting signal for compensating temperature measured by the temperature sensor based on a temperature compensation table previously mounted in the design step, and
upon carrying out the third processing, the control circuit defining the voltage setting value of the power supply voltage setting signal for compensating the temperature measured by the temperature sensor in a stage of carrying out the third processing based on the temperature compensation table, and controls the power supply voltage setting signal based on the voltage setting value.

16. The high-frequency signal processing device according to claim 15, upon carrying out the second processing, the control circuit retains a relationship of the variable bias amount and the frequency difference amount by approximating to a linear function.

17. The high-frequency signal processing device according to claim 16,
wherein the control circuit includes an automatic frequency selector unit for making the measurement circuit measure in the state in which the loop setting signal is at the OFF level and automatically searching for an optimum setting value of the first frequency setting signal upon setting the frequency of the second oscillation output signal to a target frequency, and
upon carrying out the first processing, the control circuit makes the measurement circuit measure via the automatic frequency selector unit and measures, as the frequency difference amount, a different amount between a setting value of the first frequency setting signal obtained upon setting the bias setting signal to the first bias setting value and a setting value of the first frequency setting signal obtained upon setting the bias setting signal to the second bias setting value.

18. The high-frequency signal processing device according to claim 17,
wherein the oscillation circuit includes:
an LC tank circuit including an inductor and a capacitor;
a negative resistance generating circuit including a transistor and being coupled the LC tank circuit; and
a variable current source coupled to the negative resistance generating circuit and generating the bias current corresponding to the bias setting signal, and
the LC tank circuit includes:
a first variable capacitor having a frequency controlled at the first resolution corresponding to the first frequency setting signal; and
a second variable capacitor having a frequency controlled at the second resolution corresponding to the second frequency setting signal.

19. The high-frequency signal processing device according to claim 18, further comprising:
a mixer circuit for up-converting a baseband signal using the oscillation output signal; and
a power amplifier circuit for amplifying an output signal of the mixer circuit by a gain based on a power instruction signal,
wherein the control circuit changes, upon changing the bias setting signal in the third processing, the bias setting signal based on the power instruction signal.

20. The high-frequency signal processing device according to claim 13,
wherein, before carrying out the first processing, the control circuit further carries out:
a sixth processing of making the measurement circuit measure in the state in which the loop setting signal is at the OFF level, setting the power supply voltage setting signal to a first voltage setting value, search for a second voltage setting value so that a frequency difference amount is within a predetermined range, the frequency difference amount between a frequency of the second oscillation output signal obtained upon setting the bias setting signal to a third bias setting value and a frequency of the second oscillation output signal obtained upon setting the power supply voltage setting signal to the second voltage setting value and setting the bias setting signal to a fourth bias setting signal; and
a seventh processing of retaining a relationship of a variable bias amount between the fourth bias setting value and the third bias setting value obtained in the sixth processing and a variable voltage amount between the second voltage setting value and the first voltage setting value,
wherein, upon carrying out the first processing, a voltage setting value of the power supply voltage setting signal corresponding to each of the first bias setting value and the second bias setting value is defined in the sixth processing based on the relationship retained in the sixth processing, and the frequency difference amount of the second oscillation signal is measured using each of the first bias setting value and the second bias setting value in a state in which the power supply voltage setting signal is controlled based on the defined voltage setting value, and
upon carrying out the third processing, a variable voltage value to a changed amount of the bias setting signal is defined based on the relationship retained in the seventh embodiment, and the power voltage setting signal is controlled based on the defined variable voltage amount.

* * * * *